(12) United States Patent
Fallahi et al.

(10) Patent No.: US 10,511,145 B2
(45) Date of Patent: Dec. 17, 2019

(54) GENERATION OF HIGH-POWER SPATIALLY-RESTRUCTURABLE SPECTRALLY-TUNABLE BEAMS IN A MULTI-ARM-CAVITY VECSEL-BASED LASER SYSTEM

(71) Applicant: ARIZONA BOARD OF REGENTS ON BEHALF OF THE UNIVERSITY OF ARIZONA, Tucson, AZ (US)

(72) Inventors: Mahmoud Fallahi, Tucson, AZ (US); Ewan Wright, Tucson, AZ (US); Chris Hessenius, Tucson, AZ (US)

(73) Assignee: Arizona Board of Regents on behalf of the University of Arizon, Tucson, AZ (US)

( * ) Notice: Subject to any disclaimer, the term of this patent is extended or adjusted under 35 U.S.C. 154(b) by 0 days.

(21) Appl. No.: 16/092,379

(22) PCT Filed: Dec. 19, 2017

(86) PCT No.: PCT/US2017/067359
§ 371 (c)(1),
(2) Date: Oct. 9, 2018

(87) PCT Pub. No.: WO2018/118953
PCT Pub. Date: Jun. 28, 2018

(65) Prior Publication Data
US 2019/0312408 A1    Oct. 10, 2019

Related U.S. Application Data

(60) Provisional application No. 62/569,891, filed on Oct. 9, 2017, provisional application No. 62/437,452, filed on Dec. 21, 2016.

(51) Int. Cl.
*H01S 3/10* (2006.01)
*H01S 5/10* (2006.01)
(Continued)

(52) U.S. Cl.
CPC ............ *H01S 5/1021* (2013.01); *H01S 3/082* (2013.01); *H01S 3/0804* (2013.01); *H01S 5/041* (2013.01);
(Continued)

(58) Field of Classification Search
CPC ...... H01S 5/1021; H01S 5/041; H01S 5/0604; H01S 5/18461; H01S 5/0651;
(Continued)

(56) References Cited

U.S. PATENT DOCUMENTS 5,461,637 A * 10/1995 Mooradian ............. H01S 5/041
372/11
5,699,376 A * 12/1997 Richmond ............ H01S 3/2308
372/101

(Continued)

*Primary Examiner* — Kinam Park
(74) *Attorney, Agent, or Firm* — Quarles & Brady LLP; Yakov S. Sidorin

(57) ABSTRACT

A collinear T-cavity VECSEL system generating intracavity Hermite-Gaussian modes at multiple wavelengths, configured to vary each of these wavelengths individually and independently. A mode converter element and/or an astigmatic mode converter is/are aligned intracavity to reversibly convert the Gaussian modes to HG modes to Laguerre-Gaussian modes, the latter forming the system output having any of the wavelengths provided by the spectrum resulting from nonlinear frequency-mixing intracavity (including generation of UV, visible, mid-IR light). The laser system delivers Watt-level output power in tunable high-order transverse mode distribution.

9 Claims, 11 Drawing Sheets

(51) Int. Cl.
*H01S 5/183* (2006.01)
*H01S 5/06* (2006.01)
*H01S 5/04* (2006.01)
*H01S 5/065* (2006.01)
*H01S 3/08* (2006.01)
*H01S 3/082* (2006.01)
*H01S 5/00* (2006.01)
*H01S 3/00* (2006.01)
*H01S 3/11* (2006.01)
*H01S 3/109* (2006.01)

(52) U.S. Cl.
CPC .......... *H01S 5/0604* (2013.01); *H01S 5/0651* (2013.01); *H01S 5/18361* (2013.01); *H01S 3/0092* (2013.01); *H01S 3/08054* (2013.01); *H01S 3/109* (2013.01); *H01S 3/11* (2013.01); *H01S 5/0092* (2013.01)

(58) Field of Classification Search
CPC ...... H01S 5/0092; H01S 3/0804; H01S 3/082; H01S 3/11; H01S 3/0092; H01S 3/109; H01S 3/08054
See application file for complete search history.

(56) References Cited

U.S. PATENT DOCUMENTS

| | | |
|---|---|---|
| 5,854,802 A | 12/1998 | Jin et al. |
| 2003/0120362 A1* | 6/2003 | Shchegrov ............. B82Y 20/00 700/37 |
| 2007/0147445 A1* | 6/2007 | Ishaaya .................... H01S 3/07 372/29.023 |
| 2009/0232180 A1* | 9/2009 | Damzen ................. H01S 3/082 372/97 |
| 2014/0023098 A1 | 1/2014 | Clarkson et al. |
| 2015/0288141 A1* | 10/2015 | Fallahi ..................... H01S 3/07 372/20 |
| 2016/0301477 A1 | 10/2016 | Orcutt |

* cited by examiner

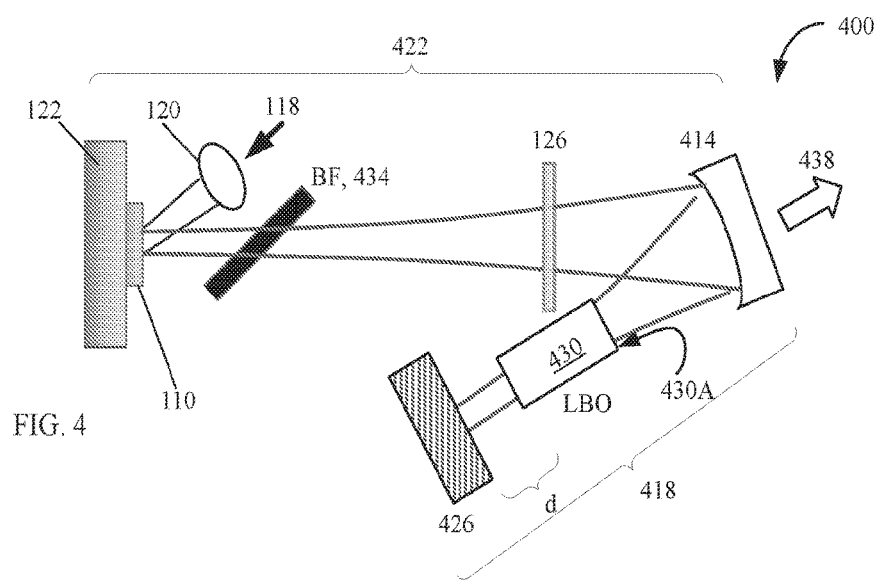
FIG. 4
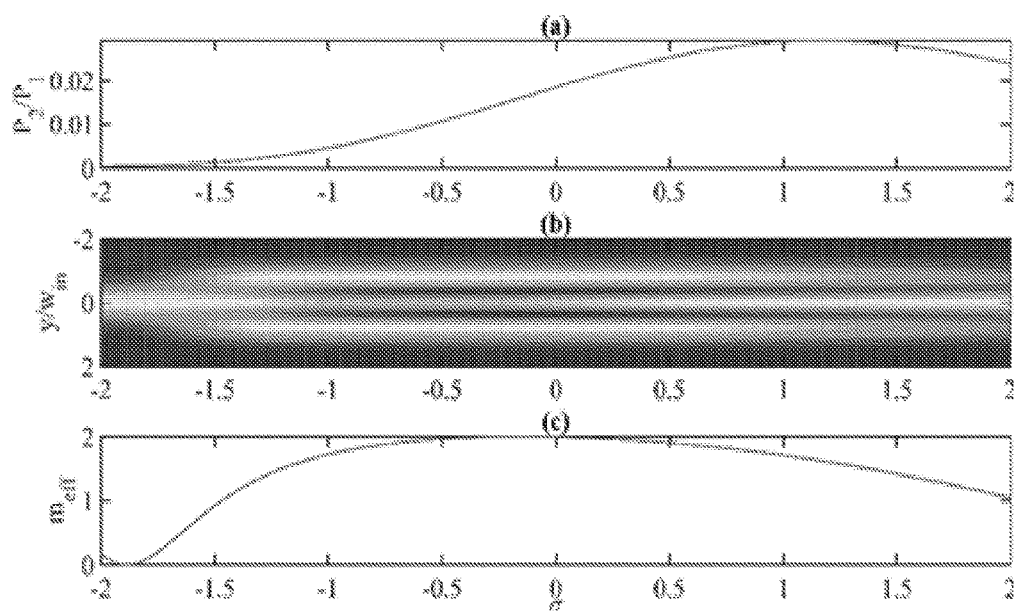
FIG. 5A
FIG. 5B
FIG. 5C

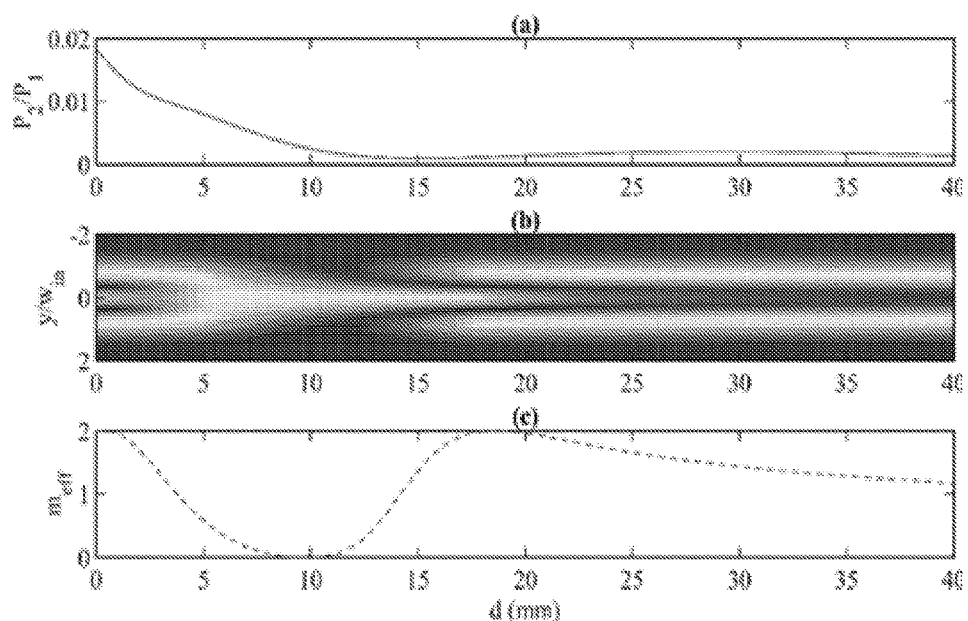
FIG. 6A
FIG. 6B
FIG. 6C
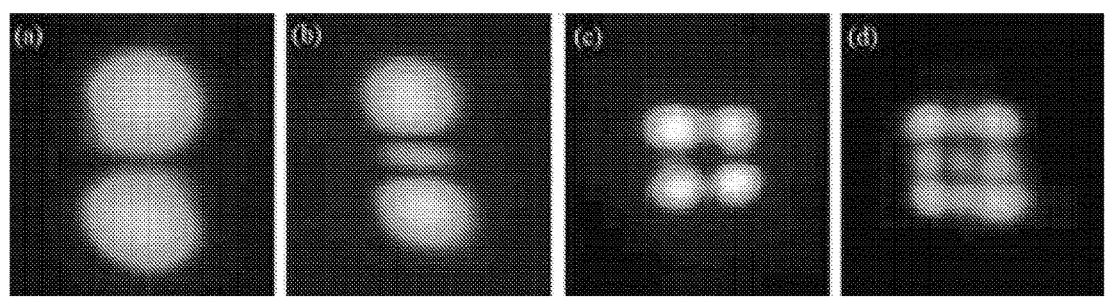
FIG. 7A          FIG. 7B          FIG. 7C          FIG. 7D

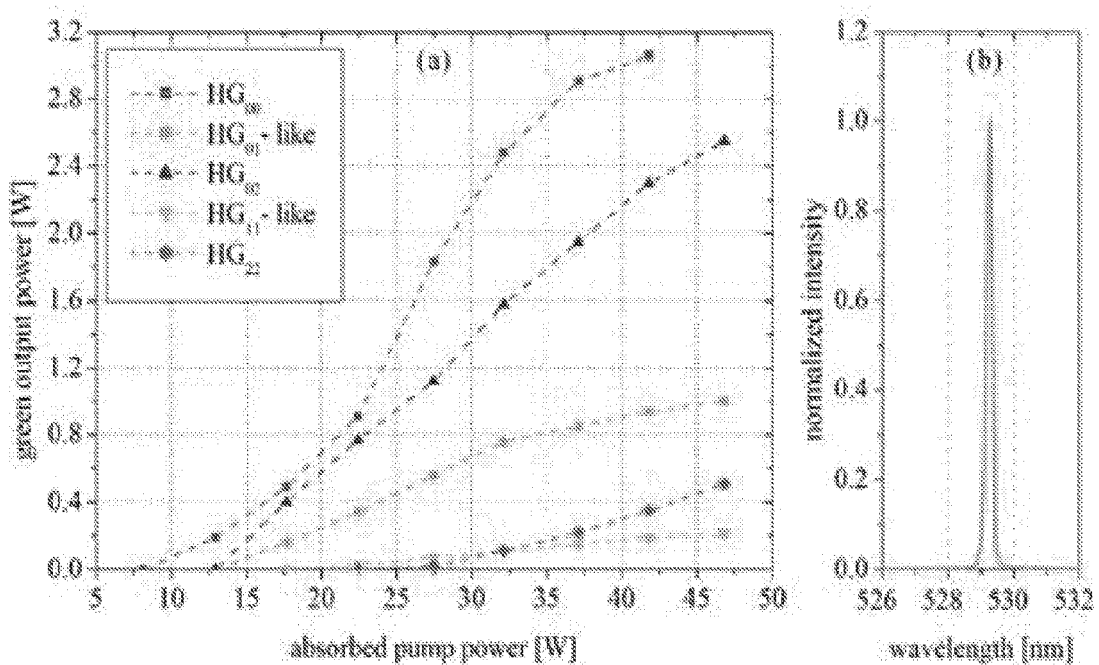
FIG. 8A
FIG. 8B
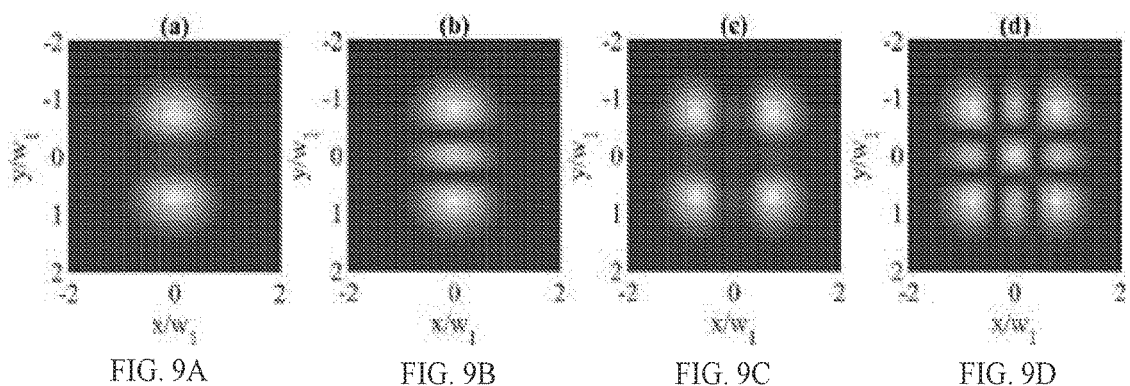
FIG. 9A  FIG. 9B  FIG. 9C  FIG. 9D

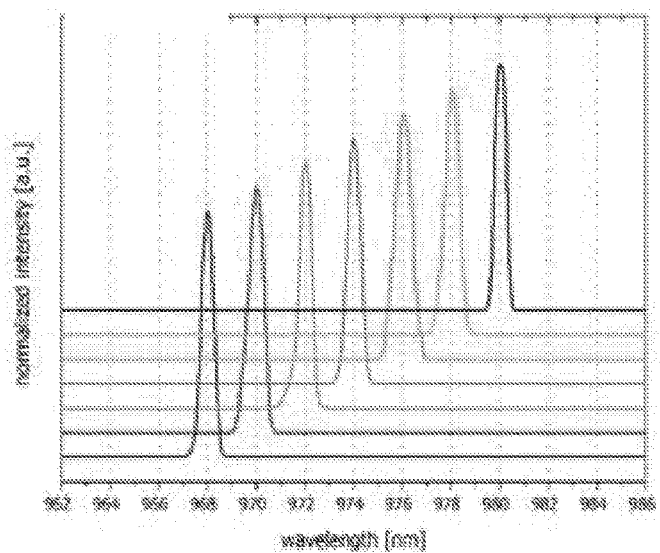
FIG. 12A
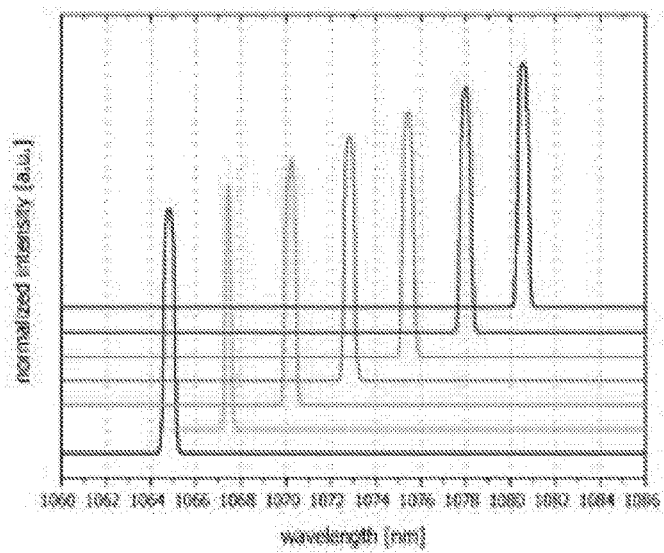
FIG. 12B
FIG. 13
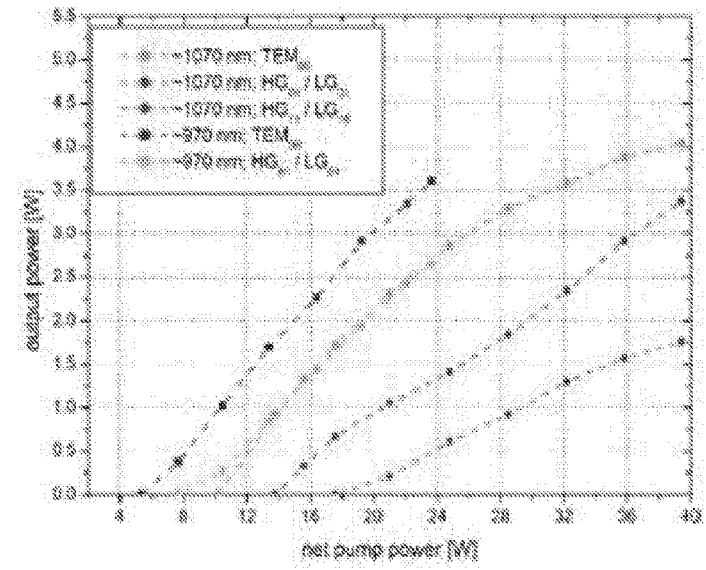

GENERATION OF HIGH-POWER SPATIALLY-RESTRUCTURABLE SPECTRALLY-TUNABLE BEAMS IN A MULTI-ARM-CAVITY VECSEL-BASED LASER SYSTEM

CROSS-REFERENCE TO RELATED APPLICATIONS

This patent application represents the U.S. national stage entry of International Application No. PCT/US2017/067359, filed on Dec. 19, 2017, and claims priority from and benefit of U.S. Provisional Patent Applications No. 62/437,452 filed on Dec. 21, 2016, and No. 62/569,891 filed on Oct. 9, 2017. The disclosure of each of the above-identified patent documents is incorporated by reference herein.

RELATED ART

In various contexts, optics as technology enabling the development of many industrial fields can be greatly enriched with the ability to produce a variety of novel laser beams that include Hermite-Gaussian (HG), Laguerre-Gaussian (LG), Bessel, Airy, and Helmholtz beams, to name just a few.

The Laguerre-Gaussian beams—that is, laser beams having a transverse distribution of optical power (interchangeably referred to herein as transverse modes) described by LG functions—are probably the most prolific realizations in practice. The beams with LG transverse modes have been used to enhance the information capacity of both classical and quantum communication channels by employing many orthogonal optical angular momentum (OAM) modes as opposed to two polarization modes. Other key applications of the LG modes derive from the ability of the light OAM to be transferred to and rotate particles such as atoms and nanoparticles, driving optical micro-machines, and excitation of matter-wave vortices in cold atomic gases. Still other applications arise in quantum entanglement of twisted photon states and quantum information processing, spiral phase contrast microscopy, and astrophysics and space physics studies. Overall, it is rather undisputed that the ability to produce beams having diverse LG modes will continue to have significant impact in the fields of quantum communication, where LG beams are used to increase the information capacity, laser trapping where the laser can provide novel trapping potentials, and laser writing of optical structures such as extended waveguides using Bessel beams. It is of significant interest to have a source of novel laser beams with high power and over a large range of wavelengths for the variety of applications.

Despite familiarity with LG modes in applied and basic science, no unified optical source configured to generate laser beam(s) in such modes at high-power levels while permitting for spectral tunability of the laser beam(s) exists up to-date: a few known attempts to generate LG laser beams produced results limited in power and/or operating wavelength range. One means of generating LG beams related art refers to makes use of a spatial light modulator (SLM) device (such as one built around a MEMS structure), which is known to operate at wavelength(s) falling within the range of about 400-1064 nm and limited to being able to handle a few Watts of power before damage of the individual reflectors of the SLM device sets in. While higher power LG beams could arguably be realized using fused silica phase-masks, a different phase mask is necessary for each realization of the OAM. Likewise, although specific lasers can be coaxed to operate on LG modes, such a solution imposes a limit on the spectral tenability of the produced LG-laser beams and requires a multiplicity of the laser sources that inevitably drives up the costs of the overall system.

Despite significant interest in generation of laser light in LG modes, the generation of high power, high efficiency beams remains a major challenge. Implementations of the present invention address an unaddressed need in developing a unified source or generator of light characterized by LG modes, and are expected to have a transformative impact on the multiple applications described above, and lead to hitherto unforeseen new uses as new wavelengths and powers are opened up.

SUMMARY

Embodiments of the invention provide a laser source that includes (i) a laser cavity network, including first and second spatially-distinct cavity arms and a collinear portion, (ii) a first optical system, disposed across an axis of the at least one of the first and second cavity arms, to either refract or reflect light incident on the first optical system while, at the same time transforming a transverse distribution of such light, and (iii) a second optical system disposed across this axis and characterized by optical losses, at the corresponding wavelength, that are non-uniformly distributed across the second optical system, the second optical system disposed between the corresponding gain medium and the first optical system.

Here, the first and second spatially-distinct cavity arms share the collinear portion, and at least one of the first and second cavity arms contains (intracavity) a corresponding gain medium including one of (i) a VECSEL-based laser gain medium, (ii) a solid-state gain medium, and (iii) a fiber amplifier and configured to provide amplification of light at a corresponding wavelength. (The discussion below refers only to the VECSEL-based gain medium, for simplicity of disclosure). The laser source if configured to maintain, in operation, generation of light having, intracavity, (a) a first transverse mode distribution in a first portion of the laser cavity network between a gain medium and the second optical system; (b) a second transverse mode distribution in a second portion of the laser cavity network between the second and first optical systems, and (c) a third transverse mode distribution in a third portion of the laser cavity network, the third portion being a remaining portion of the laser cavity network. In a specific case, such first, second, and third transverse mode distributions are different from one another.

Embodiments of the invention additionally provide a laser source including a laser cavity network that contains i) at least one output coupler (configured to transmit at least a portion of light generated intracavity by the laser source to form a light output; ii) multiple spatially-distinct cavity arms; iii) a collinear cavity portion; and (iv) an astigmatic mode converter (AMC). The AMC may be disposed intracavity or outside of the cavity network. Here: each of a first arm and a second arm is configured to support intracavity circulation of laser light at at least one wavelength; the first and second arms share the collinear cavity portion and overlap with one another along the collinear cavity portion; and at least one of said first and second arms contains an intracavity mode converter element (MCE). The light output from the laser source has a transverse mode distribution that is tunable in response to a change in spatial cooperation between a) the at least one of said first and second arms and b) at least one of the MCE and AMC. The laser source may optionally include at least one wavelength tuning mechanism disposed within the cavity network and configured to tune a wavelength of light in at least one of the first and second cavity arms. Optionally, at least one of the MCE and AMC is disposed in a collinear portion of the laser cavity network (i) to cause a formation of light having a Laguerre-Gaussian transverse mode intracavity in the collinear portion of the cavity and (ii) to maintain a circulation of such light in the collinear portion of the cavity. Optionally, the laser source includes a system configured to cause the laser source to produce the laser output in a pulsed fashion.

In one specific embodiment, the first cavity arm contains a corresponding gain medium element while the second cavity arm is devoid of a corresponding gain medium element. Here, an end-reflector of the second cavity arm is partially transparent to light at a pump wavelength, and the laser source is equipped with a pump laser source that is configured to generate pump light at the pump wavelength and that is positioned to deliver the pump light through the end reflector along an optical axis of the second cavity arm.

In a related implementation, at least one of the following conditions is satisfied: a) at least one of the first and second arms contains an intracavity non-linear frequency conversion element, and b) the output coupler is a reflector that either terminates an arm of the laser cavity network or is located within the laser cavity network. In a specific embodiment, alternatively or in addition, each of said first and second cavity arms may employ respectively-corresponding first and second laser gain media, each of which media a) is designed to amplify light at respectively-corresponding first and second wavelengths and/or b) includes one of a VECSEL-based gain medium, a solid-state gain medium; and a fiber amplifier. In such specific embodiment, the laser source may further comprise at least one wavelength tuning mechanism juxtaposed with the cavity network and configured to tune at least one of the first and second wavelengths independently from another of the first and second wavelengths while, at the same time, allowing the first and second wavelengths to become equal as a result of such tuning. In such specific embodiment, the laser source may contain (in the collinear cavity portion) an optical element defining a spatial fold of a path of light propagating intracavity and forming, intracavity, first and second Rayleigh regions of first and second light portions of light, where the first and second light portions respectively contain the first and second wavelengths, and where the first and second Rayleigh regions overlap with one another in the spatial fold. (In the latter case, at least one of the following conditions may be optionally satisfied: a) the optical element is not a reflector that terminates the cavity network and is the at least one output coupler, and b) at least one of said first and second cavity arms contains an intracavity non-linear frequency conversion element.)

In another related embodiment, at least one of the first and second arms contains a respectively-corresponding gain medium, and the MCE contains an array of mode controller elements that is configured to be repositionable across an axis of at least one of the first and second arms to cause (i) a formation of an intracavity light having a Hermite-Gaussian transverse mode, and (ii) cavity-supported propagation of such light between the MCE and the collinear portion of the cavity during an operation of the laser source. In this case, alternatively or in addition, the first and second arms may be merged into the collinear portion of the cavity at a beamsplitter, and the laser source is configured to maintain and support intracavity light having (a) a Gaussian transverse mode between said gain medium and the MCE; (b) in said Hermite-Gaussian transverse mode between the MCE and the collinear portion of the cavity; and (c) in a Laguerre-Gaussian transverse mode in the collinear portion of the cavity during the operation of the laser source.

Embodiments of the invention additionally a method that includes (i) spatially combining first and second light portions (each forming respectively corresponding first and second standing wave in respectively corresponding first and second cavity arms of a multi-arm laser cavity network) to form a mixed intracavity beam in which the first and second light portions overlap and are co-linearly propagated through a collinear portion of said laser cavity network that is common for the first and second cavity arms; and (ii) transmitting at least one of the first and second light portions through the MCE and the AMC (each of which is disposed in a corresponding of the first and second cavity arms), while transmitting the mixed beam through a non-linear optical (NLO) element disposed intracavity.

A related embodiment further provides a method including the steps of forming a first intracavity standing optical wave, at a first wavelength, between and terminated by first and second reflectors of a laser cavity network. Here, the laser cavity network includes multiple spatially-distinct cavity arms that share a collinear portion of the laser cavity network. Here, the first intracavity standing optical wave has a first transverse mode distribution in the collinear portion of the laser cavity network and a second transverse mode distribution in a first part of a first arm, where the first part is located outside of the collinear portion of the laser cavity network. Here, the first and second transverse mode distributions are different from one another. The method further includes the step of outcoupling a pre-determined portion of light energy, provided by the first intracavity standing optical wave, through an outcoupler of the laser cavity network. Here, such predetermined portion of light energy has a second wavelength, the first and second wavelengths being different from one another.

BRIEF DESCRIPTION OF THE DRAWINGS

The invention will be more fully understood by referring to the following Detailed Description of Specific Embodiments in conjunction with the not-to scale Drawings, of which:

FIG. 2A: a fundamental Gaussian transverse mode profile; FIG. 2B: the $HG_{01}$ transverse mode profile; FIG. 2C: the $HG_{10}$ transverse mode profile; and FIG. 2D: the $HG_{11}$ transverse mode profile;

FIG. 3A: output power characteristics for output laser beam having various transverse mode distributions; FIG. 3B: the laser wavelength (spectrum) of the output laser beam maintained for all transverse modes and regardless of switching from one transverse mode to another;

FIG. 4 is a schematic diagram illustrating the VECSEL-based laser system configured for delivery of light output at a frequency of the second harmonic of light generated at a fundamental frequency and amplified intracavity, in different (tunable) transverse modes;

FIGS. 5A, 5B, 5C illustrate plots representing simulation results as a function of the scaled phase-mismatch for an $HG_{01}$ beam output at a fundamental frequency (first harmonic). FIG. 5A: power at a second-harmonic (SH) frequency relative to power at a first-harmonic (FH) frequency; FIG. 5B: intensity profile of the light output at a SH frequency; and FIG. 5C: the effective mode index;

FIGS. 6A, 6B, 6C provide plots representing simulation results (similar to those of FIGS. 5A, 5B and 5C) as a function of the separation distance between the non-linear optical crystal and the planar reflector of the system of FIG. 4 for a fundamental harmonic (fundamental frequency) $HG_{01}$ beam output. FIG. 6A: power at SH relative to the power at FH; FIG. 6B: intensity profile of the light output at a SH-frequency; and FIG. 6C: the effective mode index;

FIGS. 7A through 7D present captured images of the green light output high-order transverse mode beams, generated by the system of FIG. 4, with $HG_{01}$-like (FIG. 7A), $HG_{02}$ (FIG. 7b), (FIG. 7C), and $HG_{22}$ (FIG. 7D) transverse intensity distribution profiles (transverse modes);

FIG. 8A: plots representing output power characteristics for green (SH) spatially-structured beams with various HG and HG-like transverse profiles, generated with the system of FIG. 4; FIG. 8B illustrates that the lasing wavelength for SH radiation output was meticulously maintained for all different transverse modes and regardless of switching from one transverse mode to another;

FIGS. 9A, 9B, 9C, 9D present the results of simulation corresponding to FIGS. 7A, 7B, 7C, 7D respectively. FIG. 9A: $HG_{01}$-like spatial distribution; FIG. 9B: $HG_{02}$ distribution; FIG. 9C: $HG_{11}$-like distribution; and FIG. 9D: $HG_{22}$ distribution;

FIGS. 12A, 12B are plots illustrating independently-tunable spectra of the components of the output 1500 (of the system of FIG. 10) obtained by independent operation of the BFs in two arms of the system's cavity network. FIG. 12A: tuning of the lasing wavelength of the chip 1100; FIG. 12B: tuning of the lasing wavelength of the chip 1200;

FIG. 13: the output power for outputs at various transverse modes, generated by the T-cavity VECSEL system of FIG. 10;

FIG. 14A: ~970 nm chip 1100; $HG_{01}$ and $LG_{01}$ modes; FIG. 14B: ~1070 nm chip 1200, $HG_{01}$ and $LG_{01}$ modes; FIG. 14C: ~1070 nm chip 1200m $HG_{11}$ and $LG_{10}$ modes; and FIG. 14D: overlapped (1722) and misaligned (1724) $LG_{01}$ modes from ~970 nm and ~1070 nm chips 1100, 1200.

Figure 1:
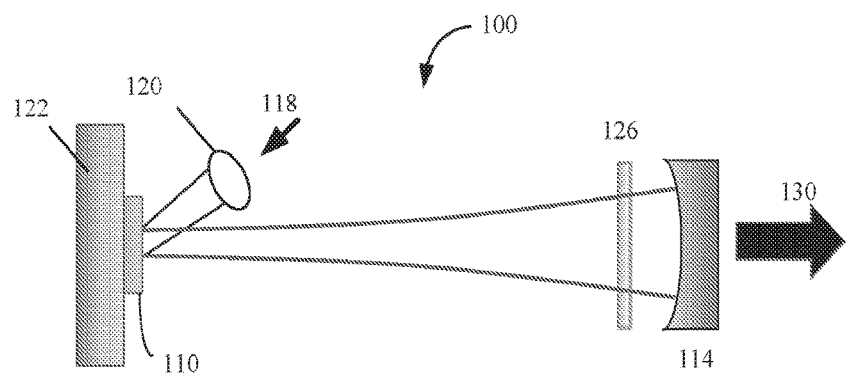
FIG. 1 is a schematic diagram of the VECSEL-based laser system configured to generate, in absence of the MCE, a laser beam in a fundamental transverse mode (characterized by a Gaussian distribution of light irradiance in a plane transverse to the axis of the laser system cavity)
Figures 2A, 2B, 2C, 2D:
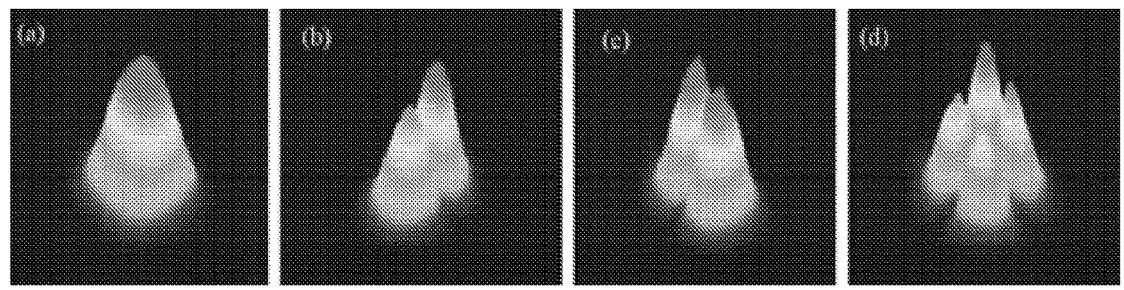
FIGS. 2A, 2B, 2C, and 2D illustrate transverse irradiance profiles of the laser output from the system of FIG. 1 registered with different coordinations/orientations of the MCE of the system.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

Implementations of the present invention provide a novel on-demand laser source configured to generate spectrally-tunable laser beam(s) in (generally variable during the frequency-tuning process) LG modes. The idea of the present invention stems from the realization that intracavity generation and nonlinear mixing of coaxial Gaussian (G) and Hermite-Gaussian (HG) modes in a multi-color, T-cavity laser device (such as one, built around a Vertical External Cavity Surface Emitting Laser, or VECSEL, for example) permits efficient HG and/or LG mode(s) generation.

The Laguerre-Gaussian (LG) beams—that is, laser beams having a transverse distribution of optical power (or transverse modes) described by LG functions—can probably boast the most prolific realization in practice. The beams with LG transverse modes have been used to enhance the information capacity of both classical and quantum communication channels by employing many orthogonal optical angular momentum (OAM) modes as opposed to two polarization modes. Other key applications of the LG modes derives from the ability of the light OAM to be transferred to and rotate particles such as atoms and nanoparticles, driving optical micro-machines, and excitation of matter-wave vortices in cold atomic gases. Still other applications arise in quantum entanglement of twisted photon states and quantum information processing, spiral phase contrast microscopy, and astrophysics and space physics studies. Overall, it is rather undisputed that the ability to produce beams having diverse LG modes will continue to have significant impact in the fields of quantum communication, where LG beams are used to increase the information capacity, laser trapping where the laser can provide novel trapping potentials, and laser writing of optical structures such as extended waveguides using Bessel beams. It is of significant interest to have a source of novel laser beams with high power and over a large range of wavelengths for the variety of applications.

Despite familiarity with LG modes in applied and basic science, no unified optical source configured to generate laser beam(s) in such modes at high-power levels while permitting for spectral tunability of the laser beam(s) exists up to-date: a few known attempts to generate LG laser beams produced results limited in power and/or operating wavelength range. One means of generating LG beams related art can refer to made use of a spatial light modulator (SLM) device (such as one built around a MEMS structure), which is known to operate at wavelength(s) falling within the range of about 400-1064 nm and limited to being able to handle a few Watts of power before damage of the individual reflectors of the SLM device sets in. While higher power LG beams could arguably be realized using fused silica phase-masks, a different phase mask is necessary for each realization of the OAM. Likewise, although specific lasers can be coaxed to operate on LG modes, such a solution imposes a limit on the spectral tenability of the produced LG-laser beams and requires a multiplicity of the laser sources that inevitably drives up the costs of the overall system.

VECSEL-based laser systems so far have been developed to provide high output powers over a wide range of fundamental lasing wavelengths (670 nm-2.4 µm) as a result of semiconductor heterostructure bandgap engineering. In particular, the well-developed VECSEL heterostructures based on GaAs/InGaAs semiconductors are considered to be preferred for generating high power continuous wave (cw) outputs in the 900 nm to 1200 nm range. The free-space external cavity of VECSELs combined with optical pumping allows for excellent mode quality, while the access to the high intracavity circulating power also allows for efficient second harmonic generation (SHG) providing tunability via the second-harmonic in addition to the fundamental harmonic, and single frequency operation can be obtained if intracavity etalons or birefringent filters are used.

In aiming to produce a high-power wavelength tunable beam, however, the VECSEL-based technology thus far has been exclusively focusing on doing so with a Gaussian transverse profile. On the other hand, higher-order modes other than the Gaussian are currently of great fundamental and technological interest (including Hermite-Gaussian (HG), Laguerre-Gaussian (LG), Bessel-Gaussian (BG), Airy, and Helmholtz beams, to mention just a few). While some attention has been paid to laser systems for generating these higher-order modes (including LG modes from a microlaser, optically pumped solid state lasers, and spatially-structured vertical cavity surface emitting lasers with mode shaping with integrated optical elements), none of the considered possibilities offered the potential for such high-order spatial modes beams to combine high power and spectral tunability. In addition, none of the considered laser-structure options is necessarily as well adapted to intracavity SHG or other forms of wave mixing as VECSELs are.

Similarly, to date the research on VECSELs was mainly focused on power-scaling or short-pulse generation at various wavelengths. However, the use of VECSEL-based laser systems for generation of higher-order LG modes carrying orbital angular momentum (OAM) beams has not been explored.

The implementations of this invention fill the gaps in the ability of currently-available technology to generate these sought-after light beams. In particular:

1) The unaddressed need of enabling a laser device to generate light at a chosen wavelength or, simultaneously at a multiplicity of wavelengths (whether in a spectrally-stationary or spectrally-tunable fashion) while, at the same time, being able to control and vary the spatial distribution of light output from the laser device in a plane transverse to the optical axis (referred to herein as a "transverse mode" of a laser beam) is solved by devising a laser-cavity network that contains multiple spatially-distinct laser cavity arms which (i) share, among themselves, at least one portion of the cavity network, and (ii) at least one of which contains, intracavity, a mode-control element (MCE) and/or an astigmatic mode converter (AMC), and, optionally, (iii) at least one of which contains a non-linear frequency conversion element intracavity.

For the purposes of this disclosure, an MCE is defined as an optical system configured to make a laser cavity (with which the MCE is juxtaposed) support lasing at a predetermined transverse mode of light that is defined by the configuration of the MCE. An MCE may be configured an optical element or system causing loss of light, which loss has a predetermined distribution in a plane transverse to the axis of the laser cavity. Alternatively, the MCE may include an optical gain element causing the amplification of light intracavity in accord with a specific predetermined distribution of gain across the beam amplified intracavity. An AMC is an optical system causing a re-distribution or spatial restructuring of first light, having first transverse distribution or mode, into second light having second transverse distribution or more upon the transmission of the first light therethrough.

Here, the control of the transverse mode of the laser output is effectuated at at least one of the wavelengths present in the laser output, and at least one cavity arm of the overall cavity network may be passive (and not contain a gain medium intracavity). It is appreciated that, in general, the nonlinear frequency conversion may be required only if the wavelength of the LG modes needs to be changed through some non-linear conversion mechanism such as, for example, second harmonic generation (SHG), sum frequency generation (SFG) or difference frequency generation (DFG). Otherwise, without a nonlinear optical element disposed intracavity the co-axial superpositions of the LG modes at fundamental wavelengths is still created in an embodiment of the invention.

The MCE(s) and AMC—taken separate or as a combination—are interchangeably referred to herein as a transverse mode converter system (TMCS). Since at least one portion of the cavity network is being shared between or among at least two cavities, intracavity light portions propagating spatially independently in different cavity arms of the cavity network are propagating co-linearly in such shared portion or region of the cavity network. The shared portion of the devised cavity network may be referred to, therefore, as a "co-linear portion of the cavity network" or "collinear cavity portion", for short.

2) The unaddressed need of enabling a laser device to simultaneously generate light at two or more wavelengths that are independently tunable without a practical limit of how small a spectral separation between such wavelengths can be made while, at the same time, being able to control the transverse mode of the laser output at at least one of the wavelengths present in the laser output is solved by devising a laser-cavity network that contains such multiple spatially-distinct laser cavity arms which (i) not only share among themselves at least one portion of the cavity network, but are also defined by optical elements preventing the intracavity amplification of light at two of these wavelengths via amplification processes occurring in the same laser gain medium, and at least one of which (ii) contains, intracavity, a TMCS. Here, an open cavity network of a laser device of the invention is structured to support a first process of laser light amplification at the first wavelength and a second process of laser light amplification at the second wavelength, which processes (i) do not share the same gain bandwidth but respectively correspond to different gain curves, and (ii) propagate along spatially different intracavity optical paths that share a common optical path portion along the direction of light propagation, while the open cavity network includes a TMCS intracavity. In such arrangement, each of the cavity arms of the overall cavity network is active in that it includes a specifically-dedicated and respectively-corresponding gain medium (such as, in one non-limiting example, a VECSEL gain medium). Here, the control of the transverse mode of the laser output is effectuated at at least one of the wavelengths present in the laser output. Moreover, in stark contradistinction with related art, in such configuration the control of transverse laser modes can be effectuated simultaneously and/or independently in two or more of the cavity arms of the overall cavity network.

Accordingly, below are discussed but several examples of a laser source, structured according the idea of the invention and based on sum- or difference-frequency generation in a T-cavity VECSEL, for both continuous-wave (CW) and pulsed operation.

The specific case of T-cavity VECSEL configuration facilitates the process of controlling the transverse mode of laser light distribution independently in multiple laser cavity arms: For example, one arm may be operating on the Gaussian or $HG_{00}$ mode and the other on the $HG_{01}$ higher-order mode. Intracavity nonlinear frequency generation may then be used to produce a new high power novel laser beam, depending on the transverse modes employed. The frequency of the novel laser beam can be controlled via the resonant frequency in each arm and the choice of sum- or difference-frequency generation.

NON-LIMITING EXAMPLES OF EMBODIMENTS

Example 1

This implementation provides demonstrates that a linear-cavity VECSEL structure, containing an MCE intracavity, is enabled to control oscillation of the cavity field in a selected higher-order HG beam at the fundamental wavelength.

In the experiments reported here, MOCVD was used to grow a VECSEL heterostructure designed to emit at about 1070 nm. The active region included 12 compressively-strained 8-nm-thick InGaAs quantum wells (QWs) with GaAs-pump-absorbing barriers and a layer of GaAsP between each neighboring QWs for strain compensation. On top of the multi-quantum well (MQW) unit the 25 pairs of alternating AlGaAs/AlAs layers were grown to operate as a high reflectivity (~99.9%) distributed Bragg reflector (DBR) at the emission wavelength. The specific thickness and composition of the heterostructure layers were judiciously chosen to achieve resonant periodic gain (RPG) such that each QW is positioned at the antinodes of the standing optical wave formed in the laser cavity. Thermal management of operation of the laser structure was accomplished by solder-bonding of a VECSEL chip to a CVD diamond element. Once bonded, selective chemical wet etching was used to remove the GaAs substrate. The surface of the chip was antireflection (AR) coated at the pump wavelength of about 808 nm, and the overall device was mounted and clamped to a water-cooled copper heat-sink system for temperature control.

As shown in the embodiment 100 of FIG. 1, a standard linear laser cavity configuration was used. The VECSEL chip 110 together with a 30 cm radius of curvature (RoC) reflector 114 (configured to operate as a 97% reflective output coupler or outcoupler) formed an approximately 25 cm long resonant cavity. The fiber-coupled 808 nm diode pump beam 118 was refocused with the lens 120 onto the surface of the VECSEL chip 110 to a spot with diameter of about 400 μm, which was slightly larger than the ~380 μm fundamental transverse mode size defined by the cavity length and the reflective outcoupler's RoC. The copper heat sink 122 was maintained at a temperature of 15° C. The MCE 126 was placed in proximity of the output coupler 114 intracavity, which allowed for operation on higher-order spatial modes as opposed to the Gaussian mode. In one specific case, the MCE 126 was structured as a fused-silica transparent substrate selectively patterned to provide a lower loss figure for a targeted HG mode distribution of the laser radiation intracavity as compared to all other modes (which resulted, during the operation of the embodiment 100, in the highest gain for the targeted HG mode).

During the operation of the system 100, the position and/or orientation of the MCE 126 was adjusted to achieve different Hermite-Gaussian mode intensity profiles, and the output powers and beam profiles of the laser output 130 were measured. In order to characterize the transverse beam structure, a DataRay BeamMap2 scanning slit beam profiler was used. To obtain an image of the lasing mode, the beam was refocused into the profiler sensor to a size of tens of microns in diameter. FIGS. 2A, 2B 2C, and 2D illustrate the fundamental mode as well as other recorded shapes of an output beam 130, and specifically the $HG_{00}$, the $HG_{01}$, the $HG_{10}$ and the $HG_{11}$ transverse intensity profiles.

Figures 3A, 3B:
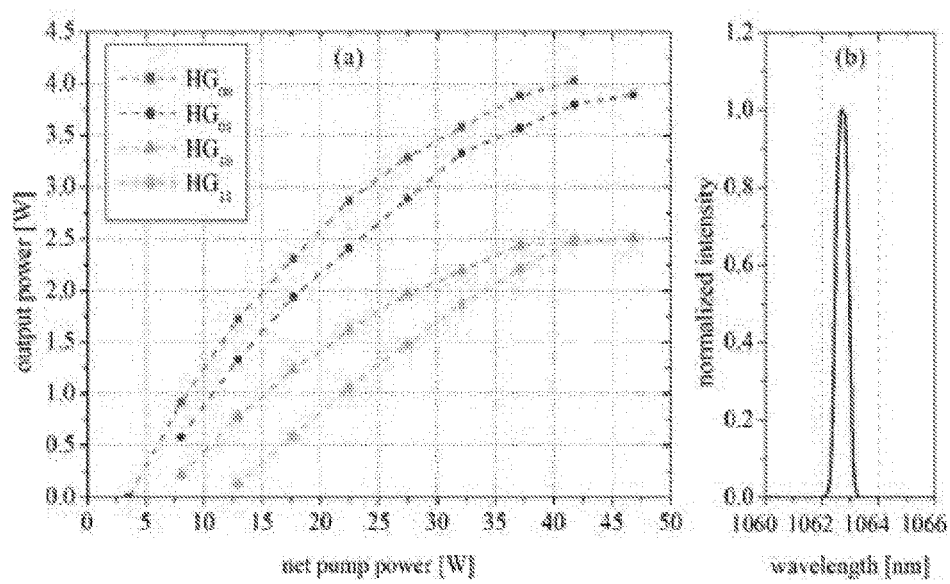
FIGS. 3A, 3B provide plots illustrating the power and spectral characteristics of laser system of FIG. 1 operating in different transverse modes (of FIGS. 2A, 2B, 2C, 2D).

FIG. 3A presents the output power characteristics for the fundamental Gaussian lasing as well as those for $HG_{01}$, $HG_{10}$ and $HG_{11}$ transverse modes of operation of the system 100. The Gaussian mode produced the highest output power exceeding 4 W. The output power in the $HG_{01}$ mode beam was about 3.8 W, whereas both when the output 130 contained the $HG_{10}$ mode and when the output contained the $HG_{11}$ the peak output power was about 2.5 W. This result is readily understood with recognition that the MCE 126 introduced a small amount of loss and that the pumped gain area at the chip 110 (optimized for the Gaussian mode) provided less gain to the higher-order transverse modes (each of which is characterized by a larger effective area than the Gaussian mode). Moreover, the $HG_{10}$ mode experienced less gain than the $HG_{01}$ mode by virtue of the fact that the pump beam was incident onto the chip 110 at an angle, thereby leading to an elliptically shaped spatial gain profile: this gain profile asymmetry is responsible for the lower output powers for the $HG_{10}$ and $HG_{11}$ modes in FIG. 3A. Since the pump spot area remained fixed for all modes, the generation of the $HG_{11}$ mode occurred at a lower level of output power as compared to the other modes. FIG. 3B illustrates that the output wavelength was maintained in all cases at about 1063 nm. The measured output powers and wavelength were proven stable within the 1 Å resolution limits of the utilized optical spectrum analyzer (OSA) and the resolution of the power meter.

Example 2. Spatially-Structured Beam Via SHG in a V-Cavity VCSEL

Here, as shown in FIG. 4, an embodiment 400 employed a common V-folded laser cavity configuration. This cavity type, compared to linear cavity of FIG. 1, is advantageous in the case of nonlinear conversion because it allows controlling the size of the transverse mode in both the gain medium and the nonlinear crystal. The spherical concave reflector 414 with a radius of curvature of 10 cm served as a folding mirror to form a folded portion of the cavity ("fold") 418 folded with respect to the linear portion of the cavity 422, while the VECSEL chip 110 and the flat end reflector 426 defined and enclosed the overall resonant cavity. For SHG operation, an LBO crystal 430 (3×3×15 mm$^3$; both facets AR coated for both 1075 nm and 537 nm), cut for type I angular phase-matching condition with angles θ=90° and ϕ=11°, was inserted into the shorter arm (fold 418) of the laser resonator a variable distance d away from the flat mirror 436. Both reflectors 414, 426 carried an HR coating for high reflection of light at 1070 nm fundamental wavelength, thereby ensuring high lasing circulating power at a fundamental wavelength, while the flat mirror 426 was additionally HR coated for a second wavelength of about 535 nm. This allowed all of the green light to be extracted through the folding mirror that had a low reflectivity (<10%) coating at 535 nm.

The same optical pumping arrangement as that of FIG. 1, with a pump spot of ~400 μm in diameter on the chip surface, was utilized. In a fashion similar to that of FIG. 1, the separation distances between the VECSEL chip 110 and the mirrors 414, 426 were chosen to ensure lasing in a fundamental Gaussian transverse mode while mode matching to the size of the optical pump 118 spot at the chip 110 and maintaining the appropriate focusing into the nonlinear crystal. (In one case, the distance from the chip 110 to the curved mirror 414 was ~21 cm, and the distance from the curved mirror 414 to the flat mirror 425 was about 6 cm). Based on these cavity dimensions, the calculated fundamental mode diameter was equal to about 100 μm at the flat mirror 425 and about 380 μm at the surface of the chip 110. The same MCE 126 was then inserted into the cavity to control which HG mode the fundamental frequency beam of light operated on. In addition, a 3 mm thick birefringent filter (BF, 434) was employed for wavelength stabilization and for maintaining a narrow linewidth of lasing light.

Theoretical Model and Simulations.

The simulations were performed in the undepleted pump beam approximation. Following the notation used by R. W. Boyd in (Nonlinear Optics Academic, Amsterdam, 2008, 3$^{rd}$ Ed., Chap. 2), the propagation of the second-harmonic field in the LBO crystal 430 is described by the paraxial wave equation $$\pm\left(\frac{\partial A_2}{\partial z}+\delta\frac{\partial A_2}{\partial x}\right)=\frac{1}{2k_2}\nabla_T^2 A_2+\frac{i\omega_2^2 d_{eff}}{k_2 c^2}A_1^2 e^{i\Delta k z} \quad (1)$$

where $A_{1,2}$ are the slowly varying envelopes of the fundamental and second-harmonic fields that are propagating dominantly along the z-axis; the ± signs correspond to propagation in the forward and backward directions in the LBO crystal. Diffraction was accounted for via the transverse Laplacian term, as was the walk-off with angle δ along the x-axis. Here $d_{eff} \cong 1$ pm/V is the effective nonlinear coefficient, and Δk is the wavevector mismatch. The fundamental field obeys a similar equation with no walk-off (θ=90° is maintained) or nonlinearity, and the subscript 2 is replaced by 1. Eq. (1) assumes that the second-harmonic field is polarized along the x-axis, and so is the direction of the walk-off.

Both in the experiment and the simulations there are two control parameters—the distance d and the wavevector mismatch Δk. Based on the estimated spot size of light fundamental frequency $\omega_0$=50 μm at the flat mirror 426, and the transverse mode selected by the MCE 1256 for operation at the fundamental harmonic (FH) by the MCE 125, for the HG transverse mode with mode indices (n, m) the fundamental frequency light-field at the flat mirror 426 is set as $$A_1(x,y)=A_0 H_n\left(\frac{x}{\sqrt{2}\,w_0}\right)H_m\left(\frac{y}{\sqrt{2}\,w_0}\right)e^{-(x^2+y^2)/w_0^2}, \quad (2)$$

where the parameter $A_0$ controls the power at the FH. Then, given the distance d, the FH light field was determined at the input facet 430A of the LBO crystal 430 using linear propagation, along with the corresponding spot size $w_{in}$ at the input facet 430A. The FH and SH fields were then propagated over the length L of the crystal using the Beam Propagation Method known in the art, from the input facet 430A to the facet nearest the flat mirror 426. Both the FH and SH fields were then propagated free-space style (with the use of a standard Fourier Optics methods) over the distance 2d back to the crystal 430, including the phase difference arising from the dispersion of air. Finally, the FH and the SH fields were propagated in reverse direction—through the LBO crystal 430—to determine the profile of the output SH field 438.

In the following, the walk-off effect is neglected. The second-harmonic polarization $P_2$ is in general driven by the square of the fundamental field $P_2 \propto A_1^2$. Now if the fundamental field is taken as a one-dimensional Hermite-Gaussian for illustration, then the polarization for the second-harmonic will vary as $$P_2(x)\propto H_m^2\left(\frac{x}{\sqrt{2}\,w_0}\right)e^{-2x^2/w_0^2}\propto \sum_{k=-\infty}^{\infty} a_k H_k\left(\frac{x}{w_0}\right)e^{-2x^2/w_0^2} \quad (3)$$

That is, the SH field will be driven by a polarization that is a superposition of HG beams with amplitudes $\alpha_k$ and based on the spot size $w_0/\sqrt{2}$, and therefore—depending on phase-matching—the output at the SH can be presented by a variety of spatial distributions.

Turning now to the simulation results, FIGS. 5A, 5B, 5C present results as a function of the scaled phase-mismatch σ=Δk$w_0^2$ for a fundamental-harmonic HG$_{01}$ beam, so (n, m)=(0,1), and d=0 (that is, the LBO crystal 430 is disposed up against the flat mirror 426). The scaled phase-mismatch can be tuned by slightly varying the angle of the crystal 430. FIG. 5A shows the generated SH power relative to the FH power, while FIG. 5B shows the calculated SH output intensity profile $|A_2(0, y)|^2$ as a function of the scaled coordinate y/$w_{in}$; $w_{in}$ being the spot size of light at the FH at the input facet 430A. The SH profile remains largely Gaussian along the x-axis in this example. In FIG. 5B, the peak intensity is normalized to unity in each case so that the profiles for different a can be compared. A person of skill in the art will readily recognize that, as the phase-mismatch is varied, the spatial structure (spatial distribution) of the generated SH light changes drastically along the y-axis, from $HG_{02}$ at σ=0 to Gaussian-like at σ=−2. To give a qualitative measure of the mode content, in FIG. 5C the effective mode index $m_{eff}$ is plotted. This is obtained by calculating the numerical value of the beam quality $M^2$ (see A. E. Siegman, "How to (maybe) measure laser beam quality." In Diode Pumped Solid State Lasers: Applications and Issues, p. MQ1. Optical Society of America, 1998), evaluated along the y-axis for the SH field, and using the relation $m_{eff}=(M^2-1)/2$, which is known to be exact for HG modes. It can be observed, therefore, that phase-matching can be used as a parameter to control the spatial distribution of the generated SH light. FIGS. 5A, 5B, 5C also attest that the peak SH power need not coincide with where integer values of $m_{eff}$ arise. Accordingly, there is a tradeoff between trying to maximize power and realizing a given spatial field structure.

FIGS. 6A, 6B, 6C show the same results as those of FIGS. 5A, 5B, 5C except for σ=0 and as a function of d (the separation distance between the non-linear crystal medium and the nearest reflector. FIG. 6B demonstrates that d can be used to control the spatial profile. For example, around d=25 μm one finds $m_{eff}\cong2$. FIG. 6A suggests low conversion efficiency at that point, but this can be countered by varying the phase-matching parameter a. In this example, peak power was obtained for σ=−1. Notably, this coincides with what was later done experimentally, that is, for a given value of d, the crystal angle can be adjusted to strike a balance between power and the spatial distribution of light generated at the SH. Based on the results of the simulation, it can be found that for a $HG_{0m}$ FH beam the effective mode index $m_{eff}$ at the SH can range between zero and 2m as the phase-matching is changed, leading to a rich variety of spatial modes. This can be further extended to the case of a $HG_{0m}$ FH beam (noting that the effective mode index evaluated along each direction can vary from zero to 2n, and zero to 2m).

Experimental Results.

This section presents the results of measurement of properties of spatially-structured SH beams, that were generated with the use of a laser system 400 by utilizing the higher-order HG modes excited at the FH wavelength (—1070 nm) in the V-cavity equipped with the MCE 126. As a reference, initially the Gaussian mode SHG output was measured for a Gaussian FH intracavity light in absence of the MCE 126 in the cavity. Next, the MCE 126 was introduced to create a circulating $HG_{01}$ FH mode, which was then converted at the LBO crystal 430 into the green output at 438. The spatial structure of the green beam 438 depended on the fine-tuning of the phase-matching angle as well as the relative position of the crystal 430 and the mirror 426 (i.e., on the beam waist position) as predicted by the simulations discussed above.

FIGS. 7A, 7B, 7C, 7D show the empirically-measured green (SH) beams for a) d=25 mm, yielding a $HG_{01}$ beam, and for b) d=0 mm, yielding a $HG_{02}$ beam. As discussed above, although FIG. 7A shows an intensity profile similar to that of a $HG_{01}$ beam, it cannot have the associated phase profile, and for this reason the terminology "$HG_{01}$-like" beam is used. This terminology has practical relevance as many applications (such as optical trapping, for example) rely on the intensity profile of the HG modes and are not dependent on the associated phase. Similarly, FIGS. 7A through 7D also show the measured profiles for a $HG_{11}$ fundamental harmonic for c) d=25 mm, yielding a $HG_{11}$-like beam, and for b) d=0 mm, yielding a $HG_{22}$ beam. These results demonstrate that the VECSEL structure with intracavity nonlinear frequency conversion element is configured to generate a rich variety of spatially-structured SH beams.

The output power at SH was also characterized for each of the structured beams and the results are compared in FIG. 8A. The green (SH) output for the $HG_{00}$ fundamental mode had the highest power of about 3.1 W. For the structured beams, the SH power decreases for the same reasons that were discussed in reference to FIGS. 3A, 3B, in addition to there being a lower nonlinear conversion efficiency. The $HG_{01}$-like and $HG_{02}$ modes reached maximum power of about 1 W and 2.6 W, respectively, while the $HG_{11}$-like and $HG_{22}$ modes highest powers were registered to be about 0.21 W and about 0.6 W, respectively. The significant power drop between these two pairs of outputs is a result of the LBO crystal's placement in the laser cavity. While for $HG_{02}$ and $HG_{22}$ beams, the crystal 430 was placed near the flat mirror 426, for the $HG_{01}$-like and $HG_{11}$-like beams the crystal 430 was placed 25 mm away from the flat mirror 426. In the latter case, the nonlinear conversion occurred for a highly expanded beam, $w_{in}\gg w_0$, leading to lowered output powers. Finally, FIG. 8B presents the spectrum for the SH light that peaks around 530 nm and has a linewidth of about 0.1 nm (which was maintained throughout the measurements)

FIGS. 9A, 9B, 9C, and 9D) show the simulations results corresponding to FIGS. 7A,7B, 7C, and 7D with the following parameters: for plots (a, c) d=25 mm and a=−1, and for plots (b, d) d=0 mm and σ=0. A good qualitative agreement between the theoretical prediction and the empirical results is evident. Overall, a person of skill in the art will readily appreciate that Examples 1 and 2 convincingly prove that VECSEL-based laser system can be configured to generate high-power spatially structured light output at the fundamental wavelength with the use of an MCE, whereby Hermite-Gaussian modes can be selected at a discretion of the user of the system. Using this approach in conjunction with intracavity SHG, the spatial structure of the SH light output can be manipulated via phase-matching along with the optional spatial repositioning of the nonlinear crystal inside the laser cavity.

The following Examples 3 and 4 disclose the designs of and experimental results obtained with multi-chip T-cavity VECSEL-based laser systems utilized for multi-color collinear generation of Hermite-Gaussian and Laguerre-Gaussian transverse modes. Here, (i) a combination of an intracavity MCE(s) and an external (with respect to the cavity) astigmatic mode converter (AMC), such combination forming a TMCS of Example 3; and (ii) a combination of the intracavity MCE(s) and the intracavity AMC(s) were used to achieve high-power LG modes, such combination forming the TMCS of Example 4. By incorporating intracavity BFs in each arm of the T-cavity in Example 3, wide wavelength tuning range (in excess of 14 nm) for each mode were demonstrated, while the output power exceeding 1.5 W was measured for all the modes.

The multi-color T-cavity VECSEL-based system is an advantageous modification of conventional VECSEL cavities, simultaneously allowing for the generation of high-power multi-color coaxial emission and a broad-range of wavelength generation through intracavity nonlinear sum or difference frequency conversion. See, for example, U.S. Pat. No. 9,231,373, the entire disclosure of which is incorporated herein by reference. The Example 3 below discloses the first demonstration of higher-order HG and LG modes generated in a two-color T-cavity VECSEL geometry. By combining intracavity mode-control elements (MCEs) with external astigmatic mode converters (AMC), a wide range of HG and LG mode pairs were demonstrated. An MCE disposed into a resonator introduces a localized loss in the transverse field, thus allowing the skilled artisan to obtain a variety of HG modes at both generated wavelengths. With the addition of an AMC, various LG modes for each wavelength are generated, while maintaining the high output power and wavelength tuning properties of each cavity.

Example 3

Figures 10, 11:
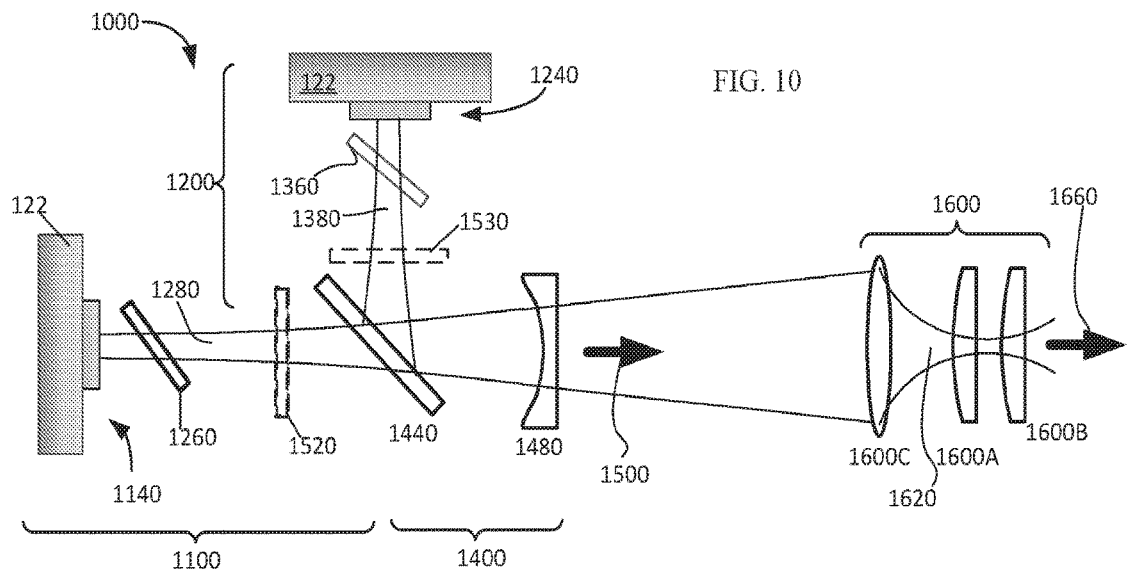
FIG. 10 schematically illustrates an embodiment employing the linear T-cavity VECSEL laser system with an external (with respect to the cavity) astigmatic mode converter.
FIG. 11 illustrates empirically measured lasing spectra of the light output produced by the two-arm laser system of FIG. 10, showing two peaks at ~972 nm and ~1072 nm (produced, respectively, by the operationally-independent cavities containing chips 1100 and 1200, respectively)

The separate VECSEL chips used in the experimental setup schematically depicted in FIG. 10 were fabricated from two different wafers with strain-compensated InGaAs/GaAs/GaAsP multi-quantum-well (MQW) heterostructures designed for emission at about 970 nm and at about 1070 nm. An MCVD process was utilized to grow the wafer in a "bottom-emitting" manner, such that the active region precedes a DBR on a GaAs substrate. To maximize the gain, in both chip structures the compositions and thicknesses of the gain regions were carefully chosen such that each QW were positioned at the antinode of the resonator standing wave—a design referred to herein as a resonant periodic gain. While both structures have active regions consisting of 12 compressively strained 8 nm thick InGaAs QWs with pump absorbing GaAs barriers and GaAsP layer between each QW for strain compensation purposes, the semiconductor compositions slightly varied between the wafers used for 970 nm and 1070 nm chips. Similarly, the designs of the DBR stacks including 25 pairs of alternating AlGaAs/AlAs were adjusted to achieve high reflectivity (~99.9%) of light at each wavelength.

To facilitate optimal thermal management to achieve efficient lasing, pairs of a CVD deposition diamond and a corresponding coated VECSEL chip were coated with Ti/Au layers and then indium solder bonded together. The removal of GaAs substrate with selective chemical wet etching guarantees an optically flat surface of a finished bonded chip. Upon the fabrication completion, the chips were mounted and clamped to water-cooled copper heat sinks and maintained at a temperature of 15° C.

The T-cavity setup 1000, along with the AMC used for the second part of the experiment, is shown in FIG. 10. (For the first part of the experiment, in which HG modes were generated, the AMC were not utilized.)

The first arm 1100 of the embodiment 1000 (which contains a first VECSEL gain chip 1140) supports the lasing at wavelength (for example, 970 nm), while the second arm 1200 (which contains a second VECSEL ship 1240) supports the lasing at wavelength $\lambda_2$ (for example, 1070 nm). A birefringent filter (BF) 1260 in the arm 1100 is oriented at a Brewster's angle such that light 1280 circulating along the arm 1100 is p-polarized (TM lasing mode). A BF 1360 of the arm 1200, on the other hand, is oriented at a Brewster's angle in such a way that the plane of incidence for light 1380 circulating in the arm 1200 defines s-polarization (TE lasing mode). Each of the (3 mm thick, in one implementation) BFs 1260, 1360 not only selects a linear polarization of the corresponding portion of intracavity light, but also facilitates the wavelength tuning operation of the device 1000 in the corresponding arms 1100, 1200. It is intended that related embodiments of the invention can utilize different spectrum-tuning mechanisms such as, for example, a spatially-repositionable intracavity diffraction grating or prism, an optical etalon, or an external cavity, or a temperature-tuning mechanism, to name just a few. According to one embodiment of the invention, each of the BFs includes quartz plates of optical quality oriented, with respect to planes of incidence of the respective intracavity fields 1280, 1380 such as to prevent optical coupling between these fields. The polarization selectivity in the cavity arms of the embodiment 1000 can be achieved, for example, by placing the BF's at Brewster angle. Therefore, generally an embodiment of the invention includes at least one wavelength tuning mechanism disposed within the cavity network and configured to tune a wavelength of light in at least one of the first and second cavity arms of the cavity network.

The optical field present in each of the regions 1100, 1200 is operationally independent from any other optical field in any other portion of the overall cavity of the device 1000 and does not share the gain medium with any other optical field. Accordingly, auxiliary elements optionally present in regions 1100, 1200 interact only with the light fields at $\lambda_1$, $\lambda_2$, respectively. The common, co-linear region 1400 of the cavity is the cavity portion between the beam splitter 1440 and the output coupler 1480, which were shared by the optical fields 1280, 1380. Here, a dichroic mirror 1440 which was AR coated at $\lambda_1$~970 nm and high reflectivity (HR) coated at $\lambda_2$~1070 nm for an angle of incidence of about 22.5°, which allows a person of skill in the art to have completely independent laser cavity portions 1100, 1200 sharing the same output coupler mirror 1480 and producing collinear output beams. The reflector 144 ensured that p-polarized light 128 propagated unabated while the s-polarized light was reflected in a substantially transverse direction (in one implementation, at about 90 degrees, in another implementation—at about 120 degrees) with respect to the z-axis. In the cavity region 1400, the two individual optical fields at wavelengths and $\lambda_2$ overlap spatially to form an overall optical intracavity field and the corresponding output 1500 characterized by the two wavelengths corresponding to two orthogonal linear polarizations.

Each of the arms 1100 and 1200 were complemented, in part of the experiment, with a respectfully-corresponding MCEs 1520, 1530 (shown in dashed lines) such that each of the two independent resonators or cavities (the first one defined between the chip 1140 and the mirror 1480, and the second one defined between the ship 1240 and the mirror 1480) contained dedicated intracavity BF and MCE. While the BFs allow for independent wavelength tuning and polarization control based on BF orientation, the presence of MCEs enables laser operation at higher-order transverse modes (in an arm with an MCE). In one implementation, each of the MCEs was made of a fused-silica transparent substrate, which was selectively etched to provide a pattern generating the least loss for a targeted HG mode (while increasing losses for non-desired HG modes). Thus, a two-color individually tunable output 1500 with orthogonally polarized beams was generated, though if required the light output components corresponding to different cavity arms 1100, 1200 could be made of the same polarization. Since the MCEs were placed between the chips 1140, 1240 and the beamsplitter 1440, each operationally-independent cavity was configured, generally, to produce a different transverse mode. The light outputs of two 808 nm pump laser diodes (not shown) were fiber-coupled and focused to form approximately 500 μm diameter spots on each of the VECSEL chips 1100, 1200 to provide optical pumping. In a specific embodiment, the shared output coupler mirror 1480 had a radius of curvature of 25 cm and was broadband coated to be about 97% reflective within 900 nm-1200 nm spectral range. Considering the total distance from the chip to the output coupler, each of the cavities was about 23 cm long.

In the second part of the experiment, an external (outside of the laser cavity) astigmatic mode converter, or AMC, 1600 was added and judiciously aligned with the T-cavity VECSEL. In one implementation, the AMC 1600 was based on a pair of identical cylindrical lenses 1600A, 1600B separated by a distance d that was dependents on their focal lengths f:

$$d = \frac{2f}{\sqrt{2}} \quad (4)$$

In this implementation, the focal lengths of the cylindrical lenses were 30 mm, causing the separation distance to be about 42 mm. To ensure the correct mode conversion, the incoming laser beam 1620 had to be of a certain Rayleigh range $Z_R$:

$$z_R = \left(1 + \frac{1}{\sqrt{2}}\right)f \quad (5)$$

and its beam waist has to be positioned approximately in the central point between those two lenses 1600A, 1600B. For this purpose, a spherical lens 1600C with focal length 150 mm was placed in front of the cylindrical lenses 1600A, 1600B (that is, between the cylindrical lenses and the output coupler 1480 of the laser cavity). The separation between the elements 1480, 1600C was about 88 mm and the distance from the spherical lens 1600C to the nearer cylindrical lens 1600A was about 250 mm.

Finally, the MCEs 1520, 1530 were appropriately adjusted to ensure that the symmetry axis of the incoming HG mode (the output 1500) be oriented diagonally at 45° with respect to the curvature axis of the cylindrical lens. The spherical lens 1600C and cylindrical lenses 1600A, 1600B were AR coated for the spectral region of 900 nm-1200 nm to ensure that the loss introduced by the AMC 1600 be is minimal and, specifically, <0.5% in one implementation.

To confirm that the overall T-cavity 1000 is configured for simultaneous and independent generation of collinear beams at two wavelengths (forming the output 1500), the throughput 1660 through the AMC 1600 was fiber coupled into an optical spectrum analyzer (OSA). FIG. 11 shows the lasing spectrum of the s-polarized output from the chip 1100 at about 972 nm and the p-polarized output from the chip 1200 at about 1072 nm. Next, the spectral tuning range of each independent laser sub-cavity was examiner by rotating the BFs 1260, 1360. While each of the chips 1100, 1200 was tuned individually to acquire wavelength spectra within a narrower scale on the OSA to increase the measurement resolution, the simultaneous tuning with both BFs was also demonstrated. FIGS. 12A, 12B provide the plots illustrating empirically-recorded tunability for the ~970 nm and 1070 nm chips, respectively. In both cases the tuning range was ~14 nm, while the spectral linewidth was maintained below 0.5 nm. Since the operation of the BFs 1260, 1360 does not depend on the operation of the MCEs 1520, 1530, these tuning results remain valid for all of the HG and LG modes generated with the use of the MCEs 1520, 1530. For a targeted high-order transverse mode output 1500, the power of the output 1500 remained consistent within the spectral tuning range of that particular mode. As discussed in U.S. Pat. No. 9,231,373, the spectral tuning of wavelengths of light generated by the gain media 1140, 1240, was optionally effectuated individually and independently from one another while allowing the corresponding wavelengths become equal to one another in the process of tuning.

The output powers of fundamental and higher-order transverse modes generated in the T-cavity VECSEL system 1000 were measured and characterized as shown in FIG. 13. Since the AMC setup 1600 did not introduce any significant loss, the measured power of HG modes (present at the output 1500 before the AMC 1600) and LG modes (present in the throughput 1660 after the AMC 1600) were considered to be approximately equal. The maximum power levels of the fundamental $TEM_{00}$ outputs were ~3.6 W and ~4 W (for ~970 nm and ~1070 nm portions of the output 1500, respectively). The $HG_{01}$ mode (in the output 1500) and the converted $LG_{01}$ mode (in the throughput 1660) from chip 1100 (at 970 nm) had a maximum power of 2.65 W. With the use of MCEs 1520, 1530, the cavity containing the chip 1200 (operation at ~1070 nm) generated $HG_{01}$ and $HG_{11}$ modes delivering ~3.4 W and ~1.8 W of maximum power, respectively. The output powers of the corresponding $LG_{01}$ and $LG_{10}$ modes (measured in throughput 1660) were substantially the same. The output power for the higher-order mode output is smaller as compared to the fundamental Gaussian beam output due to the small amount of loss introduced by the MCEs. (Notably, the pump spot sizes remained fixed for all of the modes, thus there was less gain provided for generation of higher-order modes, as was already discussed above). Beams carrying the HG modes (at the output 1500, without the AMC 1660 present) or LG modes (in the throughput 1600, with AMC 1660 present) generated by the chips 1100, 1200 were collinear. Thus, the total output power from the T-cavity was the sum of the individually measured powers.

Figure 14:
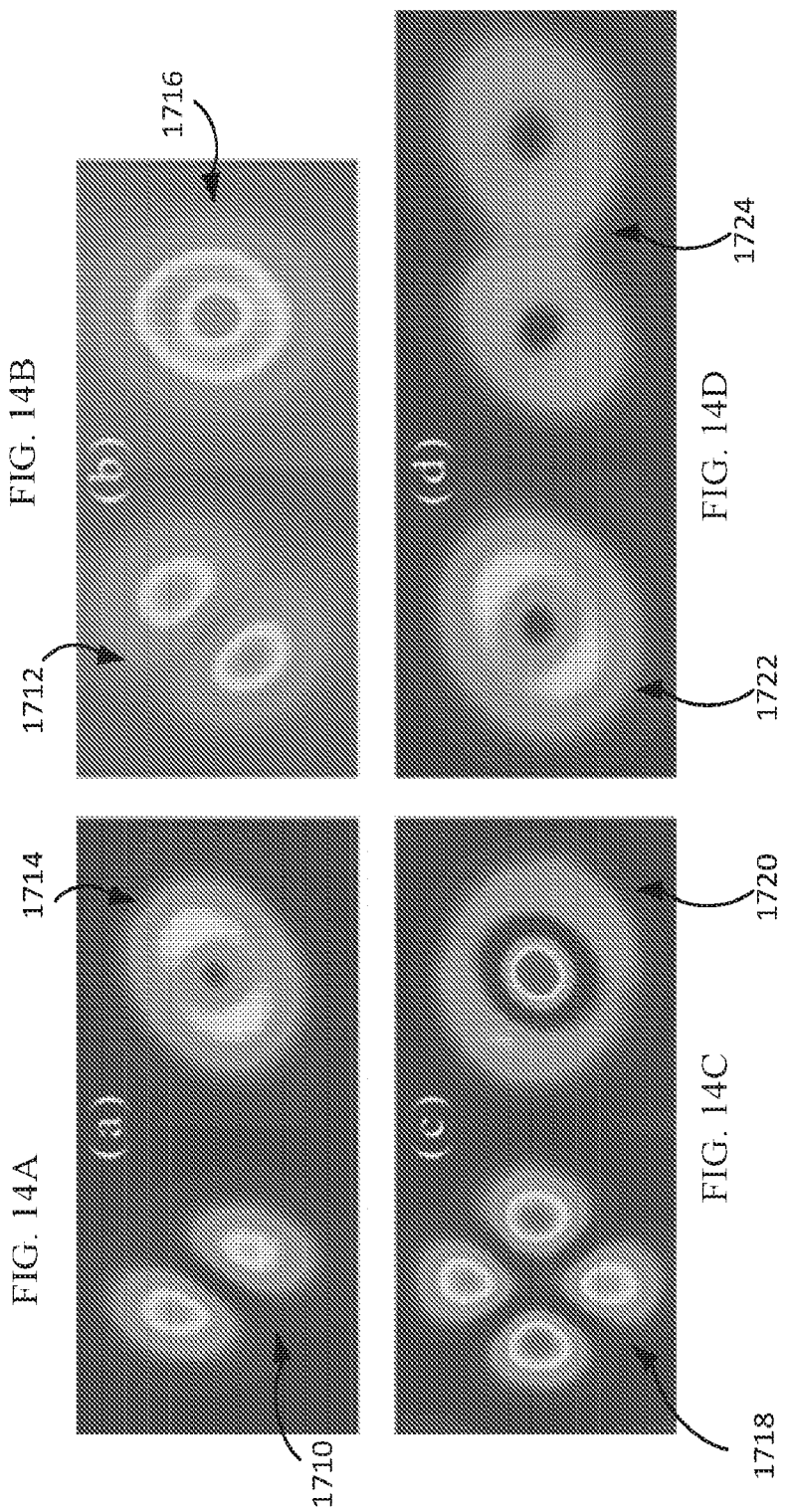
FIGS. 14A, 14B, 14C, 14D: Beam profiles of various higher-order transverse mode generated with the embodiment 1000.

Images of various transverse modes were captured with a CCD camera (not shown in FIG. 10). To procure clear separate profiles of HG and LG modes, first images were captured representing only one lasing chip. FIGS. 14A, 14B, 14C provide the images of such beams. The diagonal $HG_{01}$ beams 1710, 1712 from chips 1100, 1200, respectively, were successfully converted to $LG_{01}$ modes 1714, 1716. Also, the 1070 nm $HG_{11}$ mode 1718 was generated and converted to the $LG_{10}$ mode 1720, thereby evidencing the generation of good-quality HG modes the proper operation of the AMC 1600 to form the LG modes. To demonstrate that the laser beams from both VECSEL samples are collinear, the images of overlapping modes were procured as well. FIG. 14D shows the $LG_{01}$ modes 1722 generated at ~970 nm and ~1070 nm lasing simultaneously when they are collinearly propagating, as well as in the case when they are misaligned, 1724. The operation of the embodiment 100 therefore demonstrated a good spatial overlap between the outputs containing these two modes, while still remaining the possibility to adjust their relative positions (if required for certain applications). The wavelength (spectral) separation and the intensities of these two transverse modes was demonstrated to be individually adjustable. In a related implementation, due to the VECSEL open cavity design of the setup 1000, the AMC 1600 can be incorporated into the laser resonator itself.

Example 4

Figure 15:
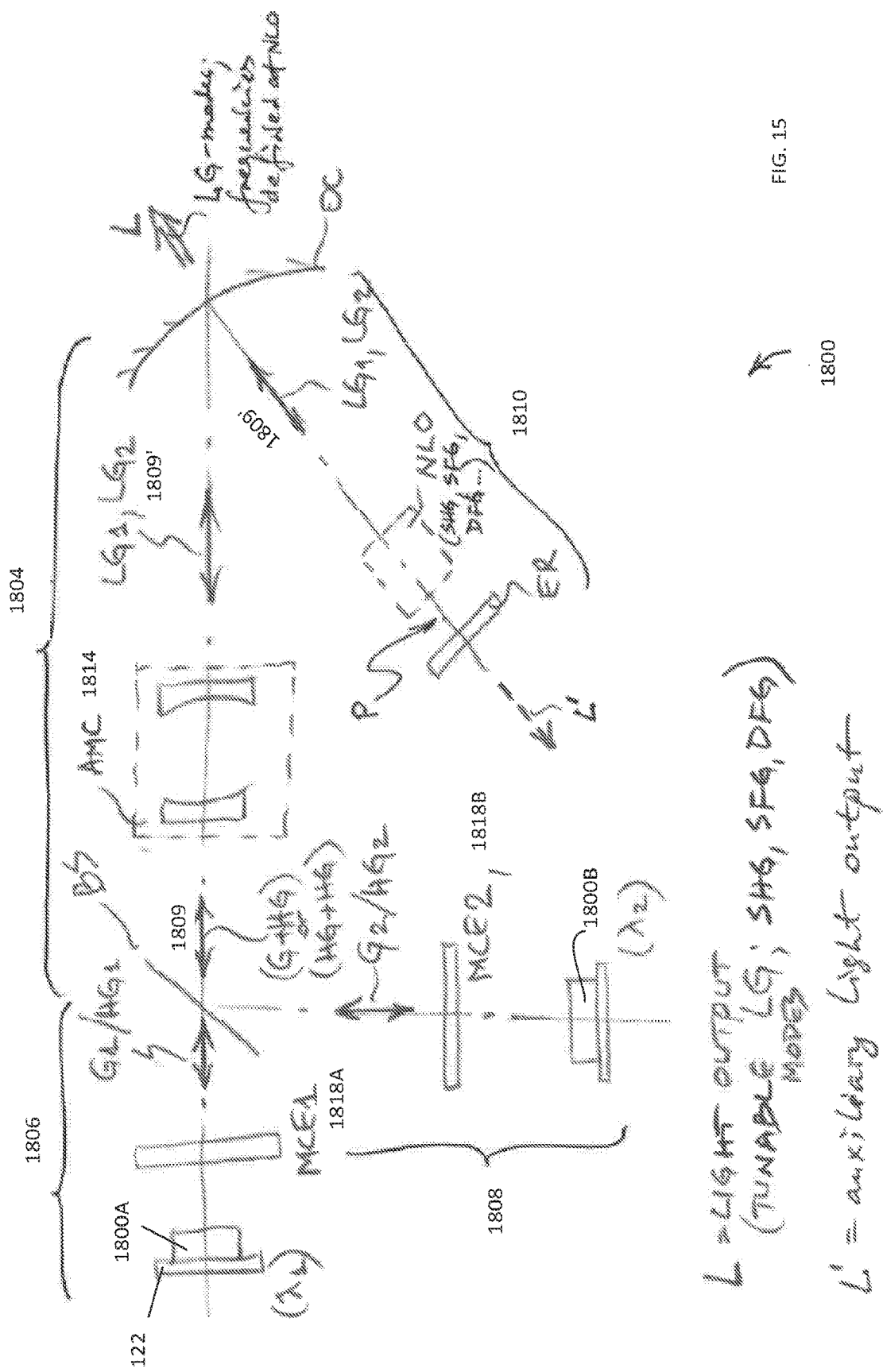
FIG. 15 is a schematic diagram of a related embodiment configured, according to the idea of the invention, as a two-cavity-arm embodiment of the laser cavity network.

In reference to another embodiment, a laser cavity network 1800 is schematically shown in FIG. 15. The network 1800 includes two cavity arms sharing the common portion 1804. The first cavity arm additionally includes the free portion 1806, while the second cavity arm additionally includes the free portion 1808. (Thus, the laser cavity network represents the T-cavity, with two cavity arms.) Portions 1806 and 1808 are spatially distinct from one another, thereby providing that the first and second cavity arms are also spatially distinct from one another. Each of the first and second cavity arms includes a respectively-correspondingly gain medium (VECSEL chips 1800A and 1800B, as shown), each of which, in operation, amplifies light supported by the respective cavity arm. Light portion supported and amplified by the chip 1800A is referred to herein as the first light portion, while light portion supported and amplified by the chip 1800B is referred to herein as the second light portion. The first and second light portions propagating intracavity within the first and second cavity arms are overlapped (or split, depending on the direction of propagation) at the beamsplitter BS and, when overlapped, they form a mixed beam 1809 that continues its propagation (in FIG. 15—from left to right) through the common portion of the laser cavity network 1800 toward the optical outcoupler OC.

As shown, the TMCS employed by the embodiment 1800 is completely intracavity and includes the intracavity AMC 1814 in combination with the intracavity MCE1 (labelled as 1818A) and the intracavity MCE2 (labelled as 1818B). The MCE1 is disposed in the free portion 1806 of the first cavity arm between the chip 1800A and the beamsplitter BS, while the MCE2 is disposed in the free portion 1808 of the second cavity arm between the chip 1800B and the beamsplitter BS. The MCE1 and MC2 are appropriately structured (as discussed below) to ensure that light distributions amplified by chips 1800A, 1800B are represented by at least one of the lowest order Gaussian mode (labelled G1, G2) and/or at least one of the Hermit-Gaussian modes (labelled HG1, HG2). Accordingly, the mixed beam 1809 has a transverse distribution of light characterized by combination of at least some of the Gaussian and Hermite-Gaussian modes defined within the first and second free portions 1806, 1808 of the individual first and second cavity arms.

The AMC portion 1814 of the TMCS is shown positioned across the optical axis intracavity in the common portion 1804 of the laser cavity network 1800. Configured with the use of refractive optical elements configured to change angle(s) of spatial divergence of the beams 1809, 1809', the AMC 1814 operates on the mixed beam 1809 such that, upon traversing the AMC 1814 (as shown—from left to right) the mixed beam 1809 is transformed to a mixed beam 109' the wavefront of which is represented by Laguerre-Gaussian modes (LG1 that correspond to the HG1 modes of the free portion 1806 of the first cavity arm, and/or LG2 that correspond to the HG2 modes of the free portion 1808 of the second cavity arm).

The outcoupler OC is disposed to form an optical fold 1810 of and within the common portion 1804 of the laser cavity network 1800, and in a specific case the OC can be structured as a curved optical reflector. At least a part of light energy contained in the mixed beam 1809' is reflected by the OC into the folded part 1810 of the common portion 1804 towards the end reflector ER. The end reflector ER is generally positioned at or in the vicinity of location of the waist of the Rayleigh region defined by the transverse distribution of light directed towards it intracavity by the outcoupler OC. The non-linear optical (NLO) element such as a non-linear crystal is disposed between the ER and the OC to ensure that at least some light energy contained in light distribution of the beam 1809' that arrived at the OC from the BS and that has been reflected by the OS towards the ER passes through the NLO-element and is non-linearly converted to light at a different optical frequency (as governed by specific circumstances describing the particular implementation of the embodiment 1800). The spectral distribution of reflectance characteristics of the OC is judiciously defined to provide for at least a partial transmission of light at wavelenghths (frequencies) resulting from the NL-conversion of light intracavity at the NLO-element, such that at least a portion of light L outcoupled from the cavity network 1800 through the OC (and forming the sought-after laser output) has an optical spectrum including the wavelengths generated as a result of interaction between the NLO-element and light from the beam 1809'. At the same time, as is readily understood, the transverse distribution of the light output L includes LG modes present in the mixed beam 1809'. Light output L includes LG modes of the nonlinearly mixed beams generated from the beams 1809. (The SFG or DFG of different LG modes generates a new LG mode at a new frequency).

In a specific implementation, an auxiliary light output L' from the laser cavity network 1800 can be formed through the ER by making it partially transparent to light at wavelengths present at point P between the NLO element and the ER. For example, the optical properties of the reflectors OC and ER can be defined to outcouple the non-linearly converted light at SFG/DFG frequenc(ies) through the OC while outcoupling at least a portion of light at least one of the wavelengths $\lambda_1$, $\lambda_2$ through the ER.

Example 5

Figure 16:
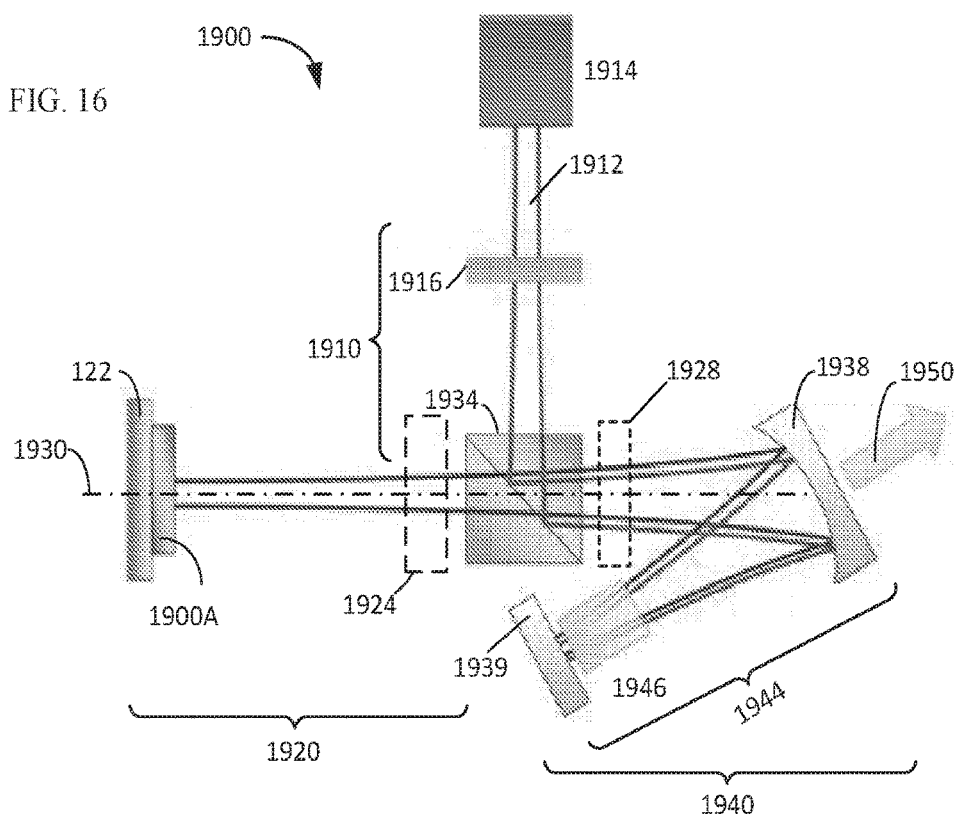
FIG. 16 is a schematic of a folded T-cavity VECSEL-based laser-cavity network with one passive cavity arm, configured to allow for controlling the transverse distribution of the laser light output (the LG mode control) and field enhancement. The combined intracavity beams, supported in individual cavity arms, are coaxially overlapped in the commonly-shared portion of the cavity to generate the laser output with the same transverse properties as those of the light distribution present in the passive cavity arm.

In a related implementation 1900, shown schematically in FIG. 16, one cavity arm of the 2-arm T-cavity-based laser-cavity network can be configured to be passive in that it is structured to not contain any gain medium (see arm portion 1910, defined between the cavity reflector 1916 and the PBS 1934) and to deliver external pump energy into the laser cavity via a low-power beam 1912, generated by the pump source 1914 and transmitted through the reflector 1916. The free-portion of the cavity arm 1920 containing the gain medium of chip 1900A also includes an MCE 1924, while the AMC 1928 is disposed across the optical axis 1930 between the PBS 1934 and the curved reflector 1938 (light outcoupler). The common collinear cavity portion of the laser network 1900 (defined between the PBS 1934 and the planar reflector 1939) is denoted as 1940. It includes a "fold" 1944 of the cavity, containing the nonlinear frequency conversion element 1946. This configuration offers substantial field enhancement and control of the transverse mode distribution (The external low power will have the desired mode for the mode control. A high-reflective mirror place after the external source and the flat mirror next to the nonlinear crystal creates a high-Q Fabry-Perot cavity resulting in significant field enhancement of the external source. As a result the configuration will offer field enhancement and mode control.) In this case, the generated laser output 1950 represents a high-power version of the incident laser beam 1912 at the desired frequency of choice. The transverse properties of light 1940 that has been outcoupled from the laser-cavity network through the light outcoupler 1938 are defined by the operation of the AMC 1928 on transverse modes (defined by the MCE 1924 in the cavity arm 1920), by analogy with the operation described above in reference to embodiment 1800 of Example 4.

Example 6

Figure 17:
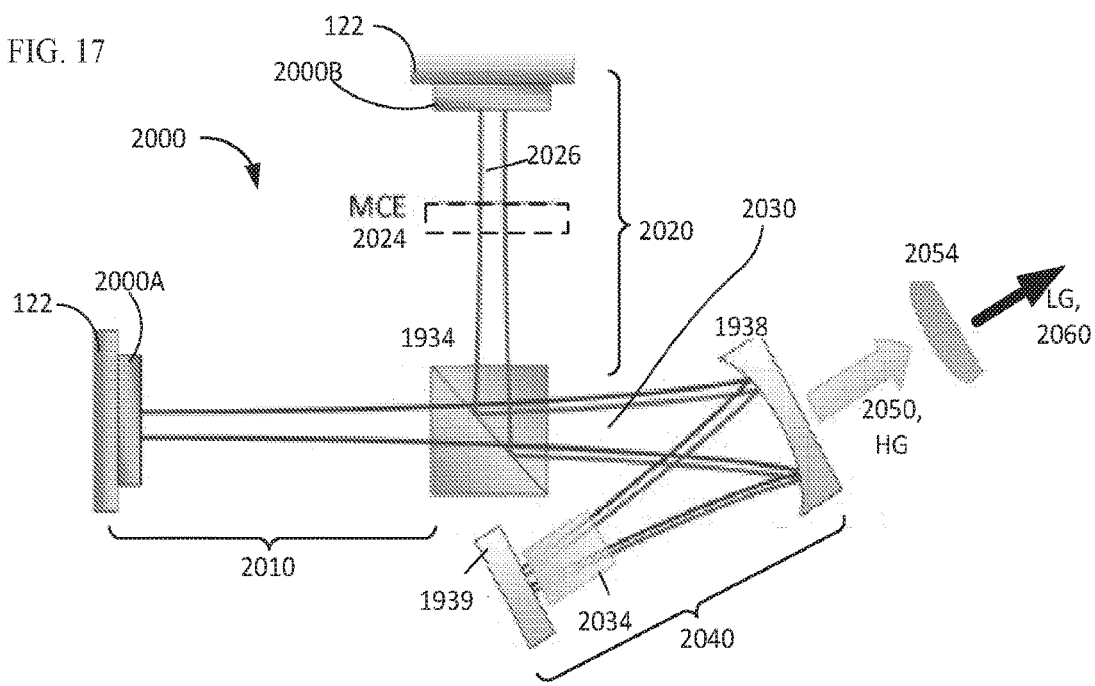
FIG. 17 is a schematic diagram of a folded T-cavity VECSEL-based laser-cavity network used for type II SFG with intracavity MCE configured as a wire to obtain an $HG_{01}$ mode distribution of light in the cavity arm containing the MCE. The external (positioned outside of the laser-cavity network) asigmatic mode converter is configured to transform the $HG_{01}$ transverse distribution of the laser output to an $LG_{01}$ transverse distribution in light that has traversed the external mode converter.

FIG. 17 shows a schematic 2000 of a two-arm T-cavity laser cavity network, in which one arm 2010 (containing the gain medium, VECSEL chip 2000A) is configured to independently lase on a fundamental Gaussian mode, while another arm 2020 (containing the gain medium, VECSEL chip 2000B) is configured to independently lase on the $HG_{01}$ mode (in favor of which the transverse distribution of light is discriminated by an MCE 2024, configured as a wire unit and disposed intracavity across the beam 2026 and the optical axis of the arm 2020). None of the components of the intracavity TMCS is shown for simplicity of illustration. The combination of these two modes, that are simultaneously present in a mixed beam 2030 propagating through the common collinear portion of the cavity network and traversing the nonlinear crystal 2034 (located in the fold 2036) upon the reflection off the curved mirror 2040, causes the generation of an $HG_{01}$ mode beam (for example, at a second harmonic frequency as a result of non-linear frequency conversion). This SH light is transmitted as the output 2050 through the outcoupler 1938 (at least semitransparent at the frequency of the output 2050). The external mode converter 2054 (composed, for example, of a pair of cylindrical lenses and shown for simplicity of illustration as a single optical element) turns the $HG_{01}$ mode into an $LG_{01}$ mode upon the traversal of the output 2050 through the converter, thereby forming a throughput 2060. Higher-order modes can be generated in a similar manner. It would be readily appreciated by a skilled artisan that when, by analogy with the embodiment of Example 4, MCE1 and MCE2 are configured as wires orthogonal to one another are placed in each of the cavity arms 2010, 2020, one of the gain-medium chips 2000A, 2000B is enabled to operate in an $HG_{01}$ mode, while the other of these gain-medium chips can operate in a $HG_{10}$ mode.

Generally, an MCE employed in any embodiment of the invention is configured to contain at least one MCE element. The MCE element, in its simplest form, may be represented by a wire or a trace of a lossy material (formed, for example, lithographically) on a substantially lossless substrate that is disposed across the optical axis intracavity to provide for different level of optical losses for light at different transverse modes (i.e., providing for non-uniform distribution of optical losses in a plane across the axis of the laser cavity) and, therefore, preferentially create conditions for amplification of those transverse modes that experience lower losses intracavity. In a related embodiment, an MCE may include an element formed by at least two "wires", which are disposed parallel to one another or that cross one another. In yet another related embodiment, an MCE includes a superposition of wires forming a wire-mesh, in which multiple wires are extending, in a given plane, in one direction substantially parallel to one another and another set of wires extends in a transverse direction (in the same given plane or in a plane parallel to the given plane). In yet another embodiment, an MCE unit is used that is structured as an array (for example, a 1D-array or a 2D-array containing any feasible combination of the above-mentioned MCE elements.

In light of the discussion presented above, a person of ordinary skill in the art will readily appreciate that an intracavity beam-mixing process, resulting in the formation of a desired transverse-mode profile, is within the scope of the invention. Such intracavity beam mixing (and corresponding hardware set-up) includes:

A) Generating light with a wavefront having a spatial distribution that includes at least one desired HG mode in a cavity arm containing a gain-medium with the use of either (i) a corresponding MCE (a portion of the TMCS) disposed in such cavity arm or (ii) an off-axis pumping of the gain medium. When multiple cavity arms contain respectively-corresponding gain media (VECSEL chips), multiple HG modes are being formed in the laser cavity network, each at a wavelength of light amplified by the corresponding gain medium in a given cavity arm. In a specific case a simple Gaussian mode can be generated, either alone or in combination with another HG mode.

B) Passing the so-generated light intracavity through an AMC (another portion of the TMCS) to transform the generated HG mode(s) to the LG mode(s). The traversal of the AMC leaves the simple Gaussian mode unchanged, intact.

C) Passing the light contained in LG mode(s) intracavity through a NLO element to generate, intracavity, at least one of SHG-light, SFG-light, and DFG-light in LG transverse mode(s).

The choice of HG modes and associated LG modes and their combination(s) provides a wide range of LG modes in the laser output extracted from the cavity network through the output coupler at the targeted wavelength(s). In an embodiment configured to provide a spectrally-tunable laser output containing at least two different wavelengths of light (such as embodiment 1800 of FIG. 15, for example), the generation of substantially any targeted wavelength may be implemented through the non-linear conversion of optical frequencies, thereby facilitating the generation of a spectrally-tunable LG-mode based laser output.

The spectral tuning of operation of any of the cavity arms of an embodiment of the invention is carried out with the use of a process discussed in U.S. Pat. No. 9,231,373, which (in a specific implementation) causes the tuning of light at first and second wavelengths (respectively generated by and supported by different cavity arms) to be independent from one another while allowing these two wavelengths to become equal to one another during the tuning process. (Such process, advantageously, has little or no effect on the operation of the components of the TMCS of the device of the invention, and for that reason is intended to be freely implemented.) The AMC portion of the TMCS may include a system of lenses and is substantially lossless at wavelengths of resonance of the cavity network. The effect of the MCE on light traversing it has also minimal effect on the cavity loss. As a result, the laser output in the form of spectrally- and/or spatially tunable/variable HG and/or LG modes is formed with inherently high power, comparable to that characterizing performance of a conventional T-cavity VECSEL-based laser system.

It is understood therefore that, generally, the partially co-linear open cavity network of the proposed device for multiple wavelength/multiple transverse mode generation is built around a cavity design that has multiple spatial cavity sleeves or branches or arms extended transversely with respect to one another and sharing a co-linear cavity portion, as discussed, for example, in the co-assigned U.S. Pat. No. 9,231,373, the disclosure of which is incorporated herein by reference for all purposes. Each of the branches includes a corresponding gain element (optionally-VECSEL chip) within the cavity. In one embodiment, a VECSEL chip may contain semiconductor quantum wells judiciously engineered to support light generation within large wavelength range (670 nm-2.4 um has been empirically demonstrated).

Example 7

Figure 18:
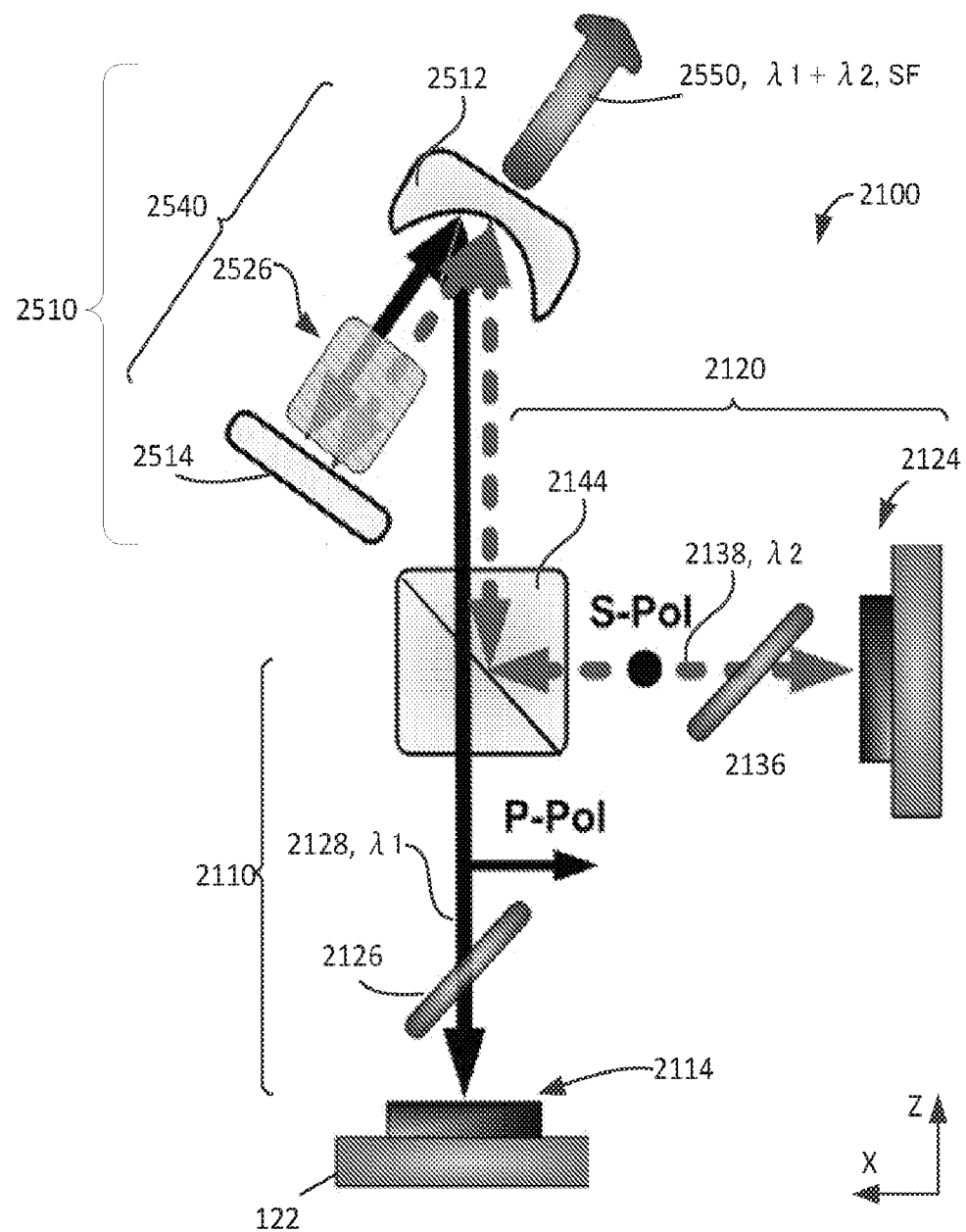
FIG. 18 is a diagram schematically illustrating a related embodiment of the collinear T-cavity VECSEL device structured according to the idea of the invention for generation of the laser light output having changeable/tunable transverse mode distribution with the spectrum corresponding to the type-II sum frequency generation or difference frequency generation based on the frequencies of light amplified in different arms of the cavity network.

Here, the components of the TMCS (that is, MCE(s) and AMC(s)) are used to complement the device structure described in reference to FIG. 5 of U.S. Pat. No. 9,231,373, reproduced herein as FIG. 18. FIG. 18 is a diagram schematically illustrating an embodiment of the co-linear T-cavity VECSEL device of the invention structured for type-II sum frequency generation or difference frequency generation. A setup 2100 is schematically shown to include a two-chip co-linear T-cavity VECSEL device that folds a portion of intracavity light 2138 (s-polarized) about a polarizing beamsplitter 2144 while allowing the second portion of light 2128 (p-polarized) to pass through the splitter 2144 unabated. This implementation lends itself to implementing a tunable intracavity type II sum frequency generation (SFG) to achieve high-power, high stability light output 2150 in the blue-green spectral bands. The T-cavity includes three spatially distinct cavity regions or portions or sections 2110, 2120, 2510 each of which supports VECSEL's lasing in a distinct fashion. As was discussed in reference to FIG. 15, the spatially distinct cavity portions 2110, 2120 are structured to support independent lasing at wavelengths $\lambda 1$, $\lambda 2$ and at orthogonal polarizations, while the collinear cavity section 2510 is shared by (is common to) intracavity light portions 2128, 2138. As a result, independent generation and tuning of each lasing wavelength $\lambda 1$, $\lambda 2$ is enabled over a wide range defined by different semiconductor gain bands corresponding to different gain media (VECSEL chips) 2114, 2124.

The collinear cavity portion 2510 (defined by the intracavity optical path from the PBS 2144 to the output coupler 2512 to the high-reflectance optionally flat mirror 2514) includes a cavity fold 2540. The output coupler 2512 is appropriately shaped and positioned such as to form a Rayleigh region of an intracavity light beam propagating between the output couple 2512 and the mirror 2514 substantially in the region of the fold 2540 itself, where the non-linear optical medium 2526 can be placed (in which case the cavity modes lasing at $\lambda_1, \lambda_2$ spatially overlap at the medium 2526). The formation of the cavity fold 2540 allows the light at the fundamental wavelengths $\lambda_1, \lambda_2$ to be substantially overlapping and co-propagating along the corresponding Rayleigh ranges to maximize the efficiency of the non-linear frequency conversion. This flexibility in beam size control facilitates efficient sum or difference frequency generation in the embodiment of the device. (Similar folding of a collinear cavity can be employed with any of other embodiments of the invention.)

While not shown in FIG. 18 for simplicity of illustration, at least one MCE were disposed in individual (not shared) portions of the arms of the cavity network (for example, between the elements 2124 and 2144, and/or between the elements 2114 and 2144, while the AMC was disposed within the common, shared, collinear portion 2510, to carry out the transformation of transverse modes within the cavity network according to the idea of the invention.

In one implementation of the embodiment 2100, strain compensated InGaAs/GaAs/GaAsP multi-quantum well (MQW) structures capable of emitting light in the proximity of 980 nm were used. The "bottom emitting" VECSEL structure included an active region containing 14 QWs (each of about 8 nm thick), surrounded by GaAsP strain compensation layers and GaAs pump absorbing barriers. A high reflectivity (R~99.9%) DBR mirror made of alternating $Al_{0.2}Ga_{0.8}As/AlAs$ was grown on top of such MQW structure. The thickness and composition of the layers were designed such that each QW be positioned at an antinode of the cavity standing wave to provide resonant periodic gain (RPG). In order to facilitate selective substrate etching process, a thin high aluminum concentration AlGaAs etch-stop layer is initially grown on the GaAs substrate prior to the active layers growth. The VECSEL structure fabrication process included solder-bonding the epitaxial side of the wafer on a high thermal conductivity chemical vapor deposition (CVD) diamond followed by substrate removal through a selective wet etching process. (See, for example, C. Hessenius et al., in Proc. Of SPIE, v. 8242, 82420E, 2012, incorporated herein by reference). The processed devices were mechanically mounted on a water-cooled copper heat sink for temperature control.

In practice, a pump spot diameter of ~500 microns was used on each of the chips 2114, 2124. (It is understood, however, that the same or different appropriately chosen pump-spot-diameter pump beams can be employed, for example as large as 1 to 2 mm, in some cases). The distance from the surface of each of the chips 2114, 2124 to the curved OC 2512 was about 19 cm and the distance from the curved OC 2512 to the HR flat mirror 2514 was about 6 cm. The temperature of the gain media 2114, 2124 was maintained at about 15 C with the use of heatsinks 122. The flat end mirror 2514 incorporated a broadband HR coating, while the coating at the surface of the curved OC 2512 exhibited high reflectance (of about 99.9%) at a fundamental lasing wavelength and low reflectance (for example, less than 0.25%) for the blue-green portion of the light output 2550. It is understood that when the two VECSEL chips 2114, 2124 are chosen from the same wafer growth, very spectrally close or nearly identical gain curves and, therefore, gain center wavelengths can be provided to support the intracavity optical fields 2128, 2138. The spectral separation between the wavelengths $\lambda 1$, $\lambda 2$ is adjusted by controlling the angular orientation of the BF(s) 2126, 2136 rotation and individual wavelength tuning of each polarization.

Example 8

Figure 19:
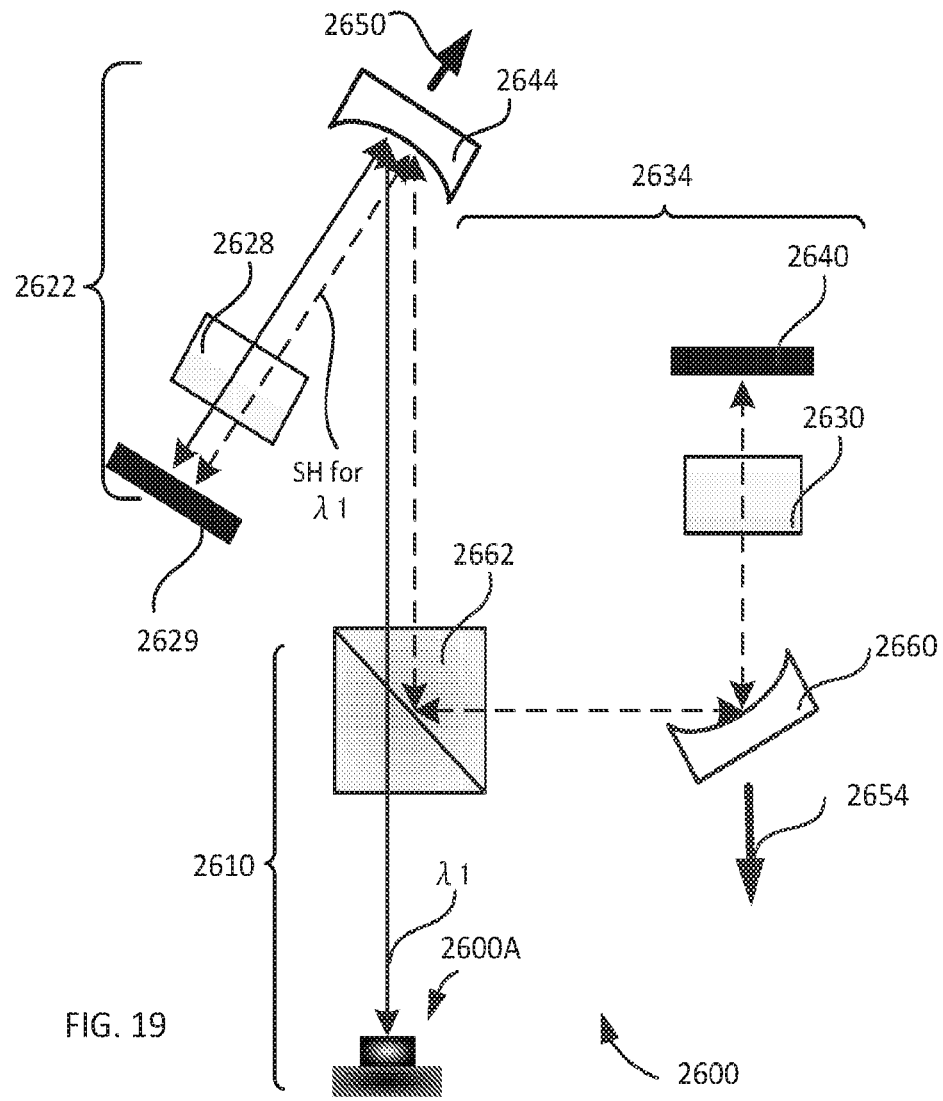
FIG. 19 is a diagram illustrating a related embodiment with a T-cavity VECSEL structure configured to generate the UV light (optionally, in addition to the generation of the IR and/or visible light) in different and spatially-changeable transverse modes.

In this case, the idea of the invention is implemented by supplementing the device structure described in reference to FIG. 10 of U.S. Pat. No. 9,231,373 (reproduced herein as FIG. 19) with the TMCS according to the idea of the invention. FIG. 19 is a diagram illustrating a T-cavity VECSEL structured to generate the UV light (optionally, in addition to the generation of the IR and/or visible light). In reference to FIG. 19, an embodiment 2600 structured based on the modification of the embodiment 2100 of FIG. 18, for example, employs the gain medium 2600A and two non-linear media elements 2628 (in the fold 2622 of the T-cavity, terminated with the reflector 2629) and 2630 in the cavity arm 2634. The element 2628 is chosen for non-linear conversion of light at IR wavelength $\lambda_1$ to visible light (at least one of which can be optionally extracted from the T-cavity through the appropriately coated output coupler 2650). For example, when $\lambda_1$~980 nm, the type I SHG in the element 2628 can be realized to generate SH light at about 490 nm and polarization that is orthogonal to that of the light at $\lambda_1$. The intracavity circulation of the SH optical field is further supported by a portion of the T-cavity including the arm 2634 that is terminated with a mirror 2240 in order to generate, with the use of the non-linear element 2630, the UV output 2654 (for example, at about 245 nm) extracted through the output coupler 2660. (It is understood that, while the PBS 2662 is shown, the non-polarizing semitransparent mirror can be used instead depending on whether it is desired to have different intracavity optical fields be similarly or orthogonally polarized. Spectral tenability of the system can be realized, for example, with the use of an angularly re-adjustable BF, not shown for simplicity of illustration. While not shown in FIG. 19 explicitly, an MCE was disposed in the individual (not shared) portion of the active arm of the cavity network (for example, between the elements 2660A and 2662), while positions for AMC included the cavity extents between the elements 2662 and 2644; and/or 2630 and 2662 to effectuate the transformation of transverse modes within the cavity network according to the idea of the invention.

While the implementations of the embodiments of the invention were described in reference to specific diagrams and laser cavity networks, it is understood that any cavity configuration described in U.S. Pat. No. 9,231,373 can be used in implementation of the idea of the preset invention as long as at least one of the individual cavity arms of the overall cavity network contains a TMCS. According to the idea of the invention, an MCE component of the TMCS is present in at least one cavity arm while an AMC component of the TMCS is also present in at least one cavity arm, intracavity. In so structuring an embodiment of the invention, the embodiment may be further complemented with at least one wavelength tuning mechanism (such as a rotatable BF) juxtaposed with the cavity network and configured to tune a first wavelength of multiple wavelengths generated by the embodiment independently with respect to a second wavelength of such multiple wavelengths while allowing the first and second wavelengths to become equal as a result of tuning.

Finally, as discussed in U.S. Pat. No. 9,231,373, in each of various embodiments, pulsed operation of the beams at fundamental frequencies (as opposed to those at non-linearly converted frequencies) can be incorporated into the setup. By the means of passive mode-locking (e.g. SESAM) or q-switching (e.g. chopper) systems juxtaposed with the embodiment of the laser source, one or both of the input waves can be pulsed, leading to space-time novel laser fields. For example, Airy-Bessel beams, that have an Airy temporal profile and a Bessel spatial profile, have been proposed as versatile linear light bullets. Accordingly, embodiments can be used to generate the full variety of such space-time novel laser pulses.

Overall, a skilled artisan will readily appreciate that a laser source, configured according to the idea of the invention, comprises a laser cavity network including first and second spatially-distinct cavity arms and a collinear portion, wherein the first and second spatially-distinct cavity arms share the collinear portion. (At least one of the first and second cavity arms contain, intracavity, a corresponding gain medium including one of a VECSEL-based laser gain medium, a solid-state gain medium, and a fiber amplifier and configured to provide amplification of light at a corresponding wavelength). The laser source also comprises a first optical system (disposed across an axis of the at least one of the first and second cavity arms, to either refract or reflect light incident thereon while transforming a transverse distribution of said light) a second optical system (disposed across said axis and characterized by optical losses, at the corresponding wavelength, that are non-uniformly distributed across the second optical system). The second optical system disposed between the corresponding gain medium and the first optical system. Optionally, both the first and the second optical systems may be located in the collinear portion of the laser cavity network.

The so-configured laser source in operation, maintains intracavity generation of light at the corresponding wavelength, said light having, intracavity, (i) a first transverse mode distribution in a first portion of the laser cavity network between the gain medium and the second optical system, (ii) a second transverse mode distribution in a second portion of the laser cavity network between the second and first optical systems, and (iii) a third transverse mode distribution in a third portion of the laser cavity network, the third portion being a remaining portion of the laser cavity network, the first, second, and third transverse mode distributions being different from one another.

A laser source further includes an optical element defining a spatial fold of a path of light propagating intracavity and forming, intracavity, first and second Rayleigh regions of first and second light portions of light, where the first and second light portions respectively contain the first and second wavelengths, and where the first and second Rayleigh regions overlap with one another in the spatial fold. Here, at least one of the following conditions is satisfied: a) such optical element is not a reflector that terminates the cavity network while such optical element is an output coupler configured to transmit a portion of light, generated intracavity, to form a light output from the laser source, and b) at least one of the first and second cavity arms contains an intracavity non-linear frequency conversion element. In a specific implementation, at least one of the following conditions may be satisfied: (i) at least one of the first and second cavity arms is devoid of a gain medium, and (ii) the first transverse mode distribution is a Gaussian distribution; the second transverse mode distribution is a Hermite-Gaussian distribution, and the third transverse mode distribution is a Laguerre-Gaussian distribution. Alternatively, each of the first and second cavity arms may contain a respectively corresponding first and second VECSEL-based laser medium to cause independent lasing at respectively-corresponding first and second wavelengths, while the laser source further comprises at least one wavelength tuning mechanism juxtaposed with the cavity network and configured to tune at least one of the first and second wavelengths independently from another of the first and second wavelengths while allowing the first and second wavelengths to become equal as a result of such tuning.

Depending on the embodiment, the first cavity arm may contain a corresponding gain medium element while the second cavity arm may be devoid of a corresponding gain medium element. In this case, an end-reflector of the second cavity arm is made partially transparent to light at a pump wavelength, the laser source is further equipped with a pump laser source that is configured to generate pump light at said pump wavelength and is positioned to deliver said pump light through said end reflector along an optical axis of the second cavity arm. Depending on the embodiment, The AMC may be disposed inside or outside the multi-arm cavity network. Alternatively or in addition (and while not necessarily shown in the drawings, for simplicity of illustrations), more than one AMC may be disposed inside at least one cavity arm of the multi-arm cavity network of the system of the invention.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

An embodiment of the system of the invention includes electronic circuitry (for example, a computer processor) controlled by instructions stored in a memory, to perform governing of the described laser source and/or specific data collection/processing steps. The memory may be random access memory (RAM), read-only memory (ROM), flash memory or any other memory, or combination thereof, suitable for storing control software or other instructions and data. Those skilled in the art would readily appreciate that instructions or programs defining the operation of the present invention may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement a method of the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

The idea and implementation of the idea of the present invention opens the door to obtaining high-power circulating within the laser cavity network LG modes, which opens the path to producing circularly symmetric transverse modes at multiple wavelengths by the means of nonlinear frequency conversion, as discussed in Examples above. The currently limited availability of higher order transverse modes in spectral regions such as UV, visible or mid-IR is, therefore, greatly expanded. Thus, the laser systems configured according to the idea of the invention, thanks to their flexibility and opportunities for customization, can be implemented when beams with particular orbital angular momentum are required for atoms or particles manipulation.

The invention as recited in claims appended to this disclosure is intended to be assessed in light of the disclosure as a whole. Various changes in the details, steps and components that have been described may be made by those skilled in the art within the principles and scope of the invention.

The invention claimed is:

1. A laser source comprising:
    a laser cavity network including first and second spatially-distinct cavity arms and a collinear portion, wherein the first and second spatially-distinct cavity arms share the collinear portion,
    at least one of the first and second cavity arms containing, intracavity,
        a corresponding gain medium including one of (i) a VECSEL-based laser gain medium, (ii) a solid-state gain medium, and (iii) a fiber amplifier and configured to provide amplification of light at a corresponding wavelength;
    a first optical system, disposed across an axis of the at least one of the first and second cavity arms, to either refract or reflect light incident thereon while transforming a transverse distribution of said light that has traversed it, and
    a second optical system disposed across said axis and characterized by optical losses, at the corresponding wavelength, that are non-uniformly distributed across the second optical system, the second optical system disposed between the corresponding gain medium and the first optical system;
    wherein said laser source is configured to maintain, in operation, intracavity generation of light at the corresponding wavelength, said light having
        a first transverse mode distribution in a first portion of the laser cavity network between the gain medium and the second optical system,
        a second transverse mode distribution in a second portion of the laser cavity network between the second and first optical systems, and
        a third transverse mode distribution in a third portion of the laser cavity network, the third portion of the laser cavity network being a remaining portion of the laser cavity network;
    wherein the first, second, and third transverse mode distributions are different from one another.

2. The laser source according to claim 1, further comprising a non-linear optical conversion element in the collinear portion of the laser cavity network.

3. The laser source according to claim 1, further comprising
    an optical element defining a spatial fold of a path of light propagating intracavity and forming, intracavity, first and second Rayleigh regions of first and second light portions,
    wherein the first and second light portions respectively contain first and second wavelengths, and
    wherein said first and second Rayleigh regions overlap with one another in the spatial fold.

4. The laser source according to claim 3, wherein at least one of the following conditions is satisfied:
    a) said optical element is not a reflector that terminates the cavity network while said optical element is an output coupler configured to transmit a portion of light, generated intracavity, to form a light output from the laser source, and
    b) at least one of said first and second cavity arms contains an intracavity non-linear frequency conversion element.

5. The laser source according to claim 1, wherein at least one of the following conditions is satisfied:
    (i) at least one of the first and second cavity arms is devoid of a gain medium, and
    (ii) wherein the first transverse mode distribution is a Gaussian distribution; the second transverse mode distribution is a Hermite-Gaussian distribution, and the third transverse mode distribution is a Laguerre-Gaussian distribution.

6. The laser source according to claim 1,
    wherein each of the first and second cavity arms contains a respectively-corresponding first and second VECSEL-based laser medium to cause independent lasing at respectively-corresponding first and second wavelengths, and further comprising at least one wavelength-tuning mechanism juxtaposed with the laser cavity network and configured to tune at least one of the first and second wavelengths independently from another of the first and second wavelengths while, at the same time, allowing the first and second wavelengths to become equal as a result of such tuning.

7. The laser source according to claim 1, wherein both the first and the second optical systems are located in the collinear portion of the laser cavity network.

8. The laser source according to claim 1, further comprising a system configured to cause said laser source to produce the laser output in a pulsed fashion.

9. The laser source according to claim 1, wherein the first cavity arm contains a corresponding gain medium element while the second cavity arm is devoid of a corresponding gain medium element,
    wherein an end-reflector of the second cavity arm is partially transparent to light at a pump wavelength,
    and further comprising a pump laser source that is configured to generate pump light at said pump wavelength and is positioned to deliver said pump light through said end-reflector along an optical axis of the second cavity arm.

* * * * *